(12) United States Patent
Graham et al.

(10) Patent No.: US 7,269,046 B2
(45) Date of Patent: Sep. 11, 2007

(54) SYSTEMS AND METHODS FOR PROGRAMMING FLOATING-GATE TRANSISTORS

(75) Inventors: David W. Graham, Atlanta, GA (US); Ethan Farquhar, Austell, GA (US); Jordan Gray, Atlanta, GA (US); Christopher M. Twigg, Marietta, GA (US); Brian Degnan, Atlanta, GA (US); Christal Gordon, Atlanta, GA (US); David Abramson, Atlanta, GA (US); Paul Hasler, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 11/382,640

(22) Filed: May 10, 2006

(65) Prior Publication Data
US 2007/0007999 A1    Jan. 11, 2007

Related U.S. Application Data

(60) Provisional application No. 60/679,539, filed on May 10, 2005.

(51) Int. Cl.
*G11C 16/00* (2006.01)
(52) U.S. Cl. ............. 365/100; 365/185.05; 365/185.23
(58) Field of Classification Search ................ 365/100, 365/102
See application file for complete search history.

(56) References Cited

U.S. PATENT DOCUMENTS

| 4,486,769 A | * | 12/1984 | Simko | 257/317 |
| 5,172,196 A | * | 12/1992 | Matsukawa et al. | 257/316 |
| 6,064,595 A | * | 5/2000 | Logie et al. | 365/185.18 |
| 6,295,226 B1 | * | 9/2001 | Yang | 365/185.01 |
| 6,300,662 B1 | * | 10/2001 | Doyle et al. | 257/390 |

FOREIGN PATENT DOCUMENTS

EP         1 096 502         *    5/2001

* cited by examiner

*Primary Examiner*—Tan T. Nguyen
(74) *Attorney, Agent, or Firm*—Troutman Sanders LLP; Ryan A. Schneider; James E. Schutz

(57) ABSTRACT

A floating-gate transistor array and method for programming the same. The floating-gate transistor array includes a plurality of transistors having a source, drain, and floating-gate, whereby the plurality of transistors is arranged into multiple rows and columns. Each row of transistors includes a row programming switch having an output connected to each floating-gate within the row, while each column of transistors includes a column programming switch having an output connected to each drain within the column. The source of each transistor is coupled with a source line corresponding to the specific row of the transistor. The row and column programming switches are utilized to select and program a desired floating-gate transistor. In an indirect programming method, two transistors share a floating gate, such that programming a programmer transistor modifies the current of an agent transistor, which is attached to the circuit, thereby permitting run-time programming.

6 Claims, 38 Drawing Sheets

FIG. 9A  FIG. 9B
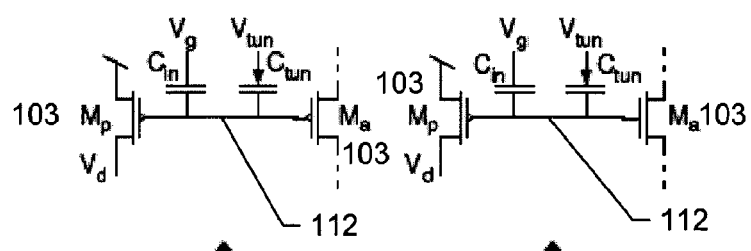
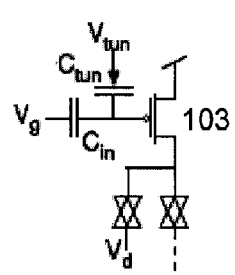
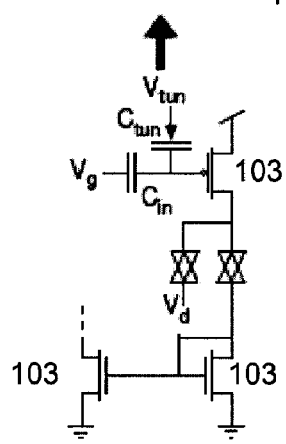
FIG. 9C  FIG. 9D

SYSTEMS AND METHODS FOR PROGRAMMING FLOATING-GATE TRANSISTORS

CROSS REFERENCE TO RELATED APPLICATION

This application claims priority of U.S. Provisional Patent Application No. 60/679,539, filed 10 May 2005, the entire contents of which is hereby incorporated by reference.

BACKGROUND

1. Field of the Invention

The present invention relates to floating-gate transistors and, more particularly, to programming floating-gate transistors for use in analog circuitry.

2. Description of Related Art

Floating-gate transistors are commonly utilized in non-volatile storage devices, such as flash memory, erasable programmable read-only memory (EPROM), and electrically erasable programmable read-only memory (EEPROM). Floating-gate metal-oxide semiconductor field-effect transistors (MOSFETs), the most commonly used floating-gate transistors, are capable of storing an electrical charge for extended periods of time without requiring an additional power supply. A floating-gate MOSFET typically includes a control gate and a floating gate, such that, when provided an electrical charge through hot-electron injection and/or Fowler-Nordheim tunneling, the charge is retained on the floating-gate due to an insulating oxide.

Floating-gate transistors may also be used in more complicated circuitry. For example, a floating-gate MOSFET (FET) may be a desirable switch element for use in a field-programmable analog array (FPAA) crossbar switch network, due to the programmed FET having a resistance similar to that of a transmission gate (T-gate) and the capacitance of a single pass-FET, while requiring no digital memory to store the state of the switch.

Generally, an FPAA is a programmable integrated circuit capable of implementing an enormous range of analog signal processing functions. The FPAA typically comprises a computational analog block (CAB) and an interconnect network, such that an FPAA may be distinguished from another by these two components. For the interconnect structure, an FPAA is most commonly connected by metal-oxide semiconductor (MOS) transistor switches driven by digital memory. Such a MOSFET (e.g., pass-FET), however, inherently includes non-linear resistance, thereby dramatically reducing the range of passable signals in comparison to the range of the power supply. Conventional alternatives to pass-FETs and T-gates often provide increased bandwidth and include $G_m$-C amplifiers, 4-transistor transconductors, and current conveyors. Unfortunately, each of these alternatives trade area for improved switch characteristics and require an additional physical memory element for maintaining connectivity within the FPAA.

As the industry pushes toward shorter design cycles for analog integrated circuits, the need for an efficient and effective FPAA becomes paramount. Indeed, the role of analog integrated circuits in modern electronic systems remains important, even with the advent of digital circuits. Analog systems, for example, are often used to interface with digital electronics in applications such as biomedical measurements, industrial process control, and analog signal processing. More importantly, analog solutions may become increasingly competitive with digital circuits for applications requiring dense, low-power, and high-speed signal processing.

Referring back to FPAA crossbar switch networks, the utilization of a floating-gate switch (e.g., FET) as the transmission element eliminates the need for digital memory and reduces resistance limitations, while maintaining a minimally sized switch element. Unfortunately, programming floating-gate switches within an FPAA crossbar switch network is no easy task. To complicate matters, the programming circuitry for floating-gate circuits is currently off-chip, thereby leading to a large programming time limited mainly by the use of an ammeter for current measurement. The larger capacitance at the board level also prevents running the programming circuitry at higher speeds.

As integrated circuits trend toward the use of lower power and lower voltage, the floating-gate transistor provides promise for switches functioning on a decreased supply voltage (as resistance on a switch increases due to the loss in the gate drive caused by the lower voltage). Floating-gate transistors may also be effectively used for precisely programming a large array of current sources in a circuit. Unfortunately, present floating-gate programming techniques require disconnection of the floating-gate transistor from the rest of the circuit, while the floating-gate is programmed.

Conventionally, floating-gate transistors may be directly programmed with a combination of hot-electron injection and Fowler-Nordheim tunneling, thereby permitting the floating-gate transistors to act as precise current sources. In order to permit programming of these floating-gate transistors, however, T-gates are typically added to the circuit in order to permit the disconnection of each floating-gate transistor from the circuit during a programming phase and to permit the reconnection of the floating-gate transistor to the circuit during a run-time phase. The addition of a 2-to-1 multiplexer for every floating-gate transistor to be programmed can be costly. The process of disconnecting the floating-gate transistor from the circuit may decrease the maximum speed of operation and the overall accuracy of the circuitry. Moreover, the addition of the 2-to-1 multiplexers significantly increases the required die real-estate (e.g., silicon footprint) and necessary supply overhead.

What is needed, therefore, is a system and method of effectively programming a floating-gate array, such as an FPAA crossbar switch network, utilizing programmable floating-gate switches, such that digital memory is not needed to store the state of the switch. Further, what is needed is a system and method for programming floating-gate transistors on-chip to reduce programming delays, without compromising circuitry performance. Moreover, what is needed is a system and method of programming floating-gate transistors that does not require disconnection of the floating-gate transistors from the circuitry and that does not necessarily require the addition of a 2-to-1 multiplexer for every floating-gate transistor to be programmed. It is to such systems and methods that the present invention is primarily directed.

BRIEF SUMMARY OF THE INVENTION

Briefly described, the present invention comprises a floating-gate transistor array and method for programming the same. The floating-gate transistor array includes a plurality of transistors having a source, drain, and floating-gate, whereby the plurality of transistors is arranged into multiple rows and columns. Each row of transistors includes a row programming switch having an output for selecting the row, while each column of transistors includes a column programming switch having an output for selecting the column. Each transistor is associated with a capacitor, such that a first terminal of the capacitor is coupled with the floating-gate and a second terminal of the capacitor is coupled with the output of a corresponding row programming switch. The drain of each transistor is coupled to the output of a corresponding column programming switch. Further, the source of each transistor is coupled with a source line corresponding to the specific row of the transistor.

The row programming switches are coupled to a ramp generator adapted to provide voltage pulses during selection and programming phases. The column programming switches are coupled to an external voltage source, which also assists in the selection and programming phases. In order to program a predetermined floating-gate transistor, it should first be selected. Selection begins by pulling up the source lines of all the transistors to the power supply. The drain lines of the transistors are also pulled up to $V_{DD}$ until selected for programming, at which time the drain line is connected to an external voltage source. The gate input lines of the transistors may be switched between an external potential and $V_{DD}$ depending upon the selection circuitry used for programming. Once the predetermined floating-gate transistor is selected, it may be programmed using hot-electron injection and tunneling.

The present invention provides for programming a single floating-gate transistor, a whole row or column of floating-gate transistors, or a subset of floating-gate transistors within a row or column. To select a single floating-gate transistor for programming, the row selection switch having an output coupled with the desired floating-gate transistor is activated. Also, the column selection switch having an output coupled with the desired floating-gate transistor is activated. The point where the output of the row selection switch intersects with the output of the columns selection switch is the location of the desired floating-gate transistor within the array.

A complete row or column of floating-gate transistors may be selected for programming by activating the row selection switch or column selection switch corresponding to the row or column desired for programming. For example, if a row of floating-gate transistors is desired for selection, the corresponding row selection switch is activated. Similarly, if a column of floating-gate transistors is desired for selection, the corresponding column selection switch is activated.

A subset of floating-gate transistors within a row or column may be selected for programming by first activating the row selection switch or column selection switch corresponding to the row or column including the subset of floating-gate transistors. Once the correct row or column is selected, then a row or column selection switch is activated for every intersection of the selected row or column that represents the location of a floating-gate transistor included in the subset.

In another embodiment of the present invention, a floating-gate transistor may be programmed indirectly. In this indirect programming method, two transistors share a floating gate allowing one to exist directly in a circuit, while the other is reserved for programming. The programmer transistor may be programmed using hot-electron injection and tunneling. As the charge on the programmer transistor is modified, the current of the transistor connected to the circuit is also modified.

These and other objects, features, and advantages of the present invention will become more apparent upon reading the following specification in conjunction with the accompanying drawings.

BRIEF DESCRIPTION OF THE FIGURES

FIGS. 9A-9D, collectively known as FIG. 9, are schematic diagrams illustrating a programming structure for a floating-gate transistor utilizing direct and indirect programming techniques in accordance with an exemplary embodiment of the present invention.

DETAILED DESCRIPTION OF PREFERRED EMBODIMENTS

Figure 1:
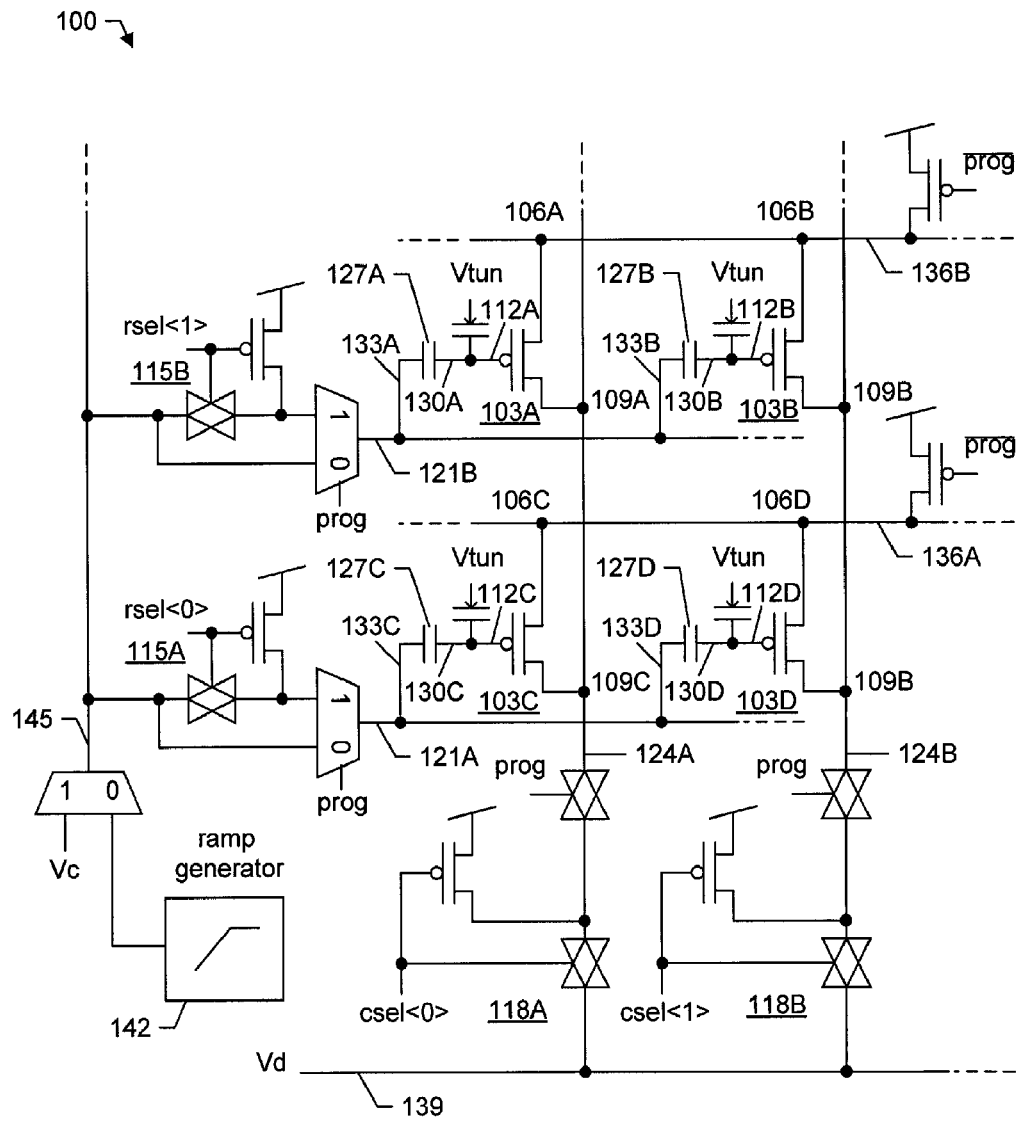
FIG. 1 is a schematic diagram illustrating a field-programmable analog array (FPAA) crossbar switch network utilizing a floating-gate switch as a transmission element in accordance with an exemplary embodiment of the present invention.

Referring now in detail to the drawing figures, wherein like reference numerals represent like parts throughout the several views, FIG. 1 illustrates a field-programmable analog array (FPAA) crossbar switch network utilizing a floating-gate switch as a transmission element in accordance with an exemplary embodiment of the present invention. Traditionally, FPAAs are distinguished from one another by two basic components: a computational analog block (CAB), and an interconnect network. An FPAA's interconnect structure is most commonly connected by MOS transistor switches driven by digital memory. If T-gates are not introduced, the range of passable signals within an FPAA is dramatically smaller than the range of the power supply, because of the non-linear resistance of the MOSFET. Although alternatives to pass-FETs exist to improve bandwidth, such as $G_m$-C amplifiers, 4-transistor transconductors, and current conveyers, these alternatives often trade area for improved switch characteristics and still require physical memory for maintaining connectivity.

Most conventional FPAA crossbar switch networks do not have programmable switches (i.e., adjustable conductance) and a significant amount of space is required for a memory element for each switch device within the network. Conventional FPAA crossbar switch networks do not have programmable switches, because it would generally require that each transistor be surrounded with multiple switching components designed to isolate the transistor for programming. As the number of programmable transistors within an array increases, so would the number of switching components needed to isolate each of the transistors. Obviously, for each programmable transistor used within a conventional FPAA crossbar switch network, a predetermined and significant amount of space would be necessary on the chip for the multiple components.

The present invention removes the isolation switch components that would be coupled with each transistor and provides a single switch for each row and each column of an array, thereby greatly decreasing the amount of die space required to implement an FPAA crossbar switch network with programmable switches. Programming a particular transistor, a row or column of transistors, or a subset of transistors may be accomplished using the present invention through selection programming.

Further, the present invention provides an improved FPAA crossbar switch network system utilizing a floating-gate, programmable switch as the transmission element, thereby making it possible to eliminate digital memory and resistance limitations, while maintaining a minimally sized switch element. A floating-gate transistor is a desirable switch element for use in a crossbar switch due to it having a resistance similar to that of a transmission gate, the capacitance of a single pass-FET, and requires no digital memory to store the state of the switch. As a result, a floating-gate FET crossbar network can achieve a higher bandwidth than a transmission gate based network. Additionally, the resulting floating-gate implementation has a smaller silicon footprint than an array of transmission gates with the necessary support structures. Moreover, the resistance of the floating-gate switch may be adjusted by modulating the input gate voltage during channel hot-electron injection.

The switches described herein may be part of a floating-gate transistor array 100 used as a crossbar network in FPAAs. The switches may include multiplexors or other suitable switching device. As illustrated in FIG. 1, the floating-gate transistor array 100 may comprise a plurality of transistors 103, such that each transistor 103 includes a source 106, a drain 109, and a floating-gate 112. Generally, the floating-gate transistor array 100 may be configured to include at least two rows and at least two columns of transistors 103, thereby forming a traditional array configuration. Although FIG. 1 provides a floating-gate transistor array 100 having two columns of transistors 103 and two rows of transistors 103 (e.g., a 2×2 array of transistors 103), the present invention may include many additional rows and columns of transistors 103 or, alternatively, may include a two column, one row (2×1) or one column, two row (1×2) transistor configuration. Indeed, the dashed lines in FIG. 1 indicate that the illustrated floating-gate transistor array 100 is only a portion of a larger, more complete floating-gate transistor array 100. Accordingly, one skilled in the art will recognize that the present invention may be scaled to include many (e.g., millions) transistors 103.

The floating-gate transistor array 100 may also include a plurality of row programming switches 115 and a plurality of column programming switches 118, such that a row programming switch 115 exists for each row of transistors 103 within the floating-gate transistor array 100 and a column programming switch 118 exists for each column of transistors 103 within the floating-gate transistor array 100. Each row programming switch 115 includes an output 121 in communication with each transistor 103 of the corresponding row. Similarly, each column programming switch 118 includes an output 124 in communication with each transistor 103 of the corresponding column. More specifically, each drain 109 of each transistor 103 within a specific column is coupled to the output 124 of the corresponding column programming switch 118.

Further, the floating-gate transistor array 100 may include a plurality of capacitors 127, for coupling the floating-gate 112 to the programming selection switch. Each capacitor 127 includes a first terminal 130 and a second terminal 133. The first terminal 130 of a capacitor 127 may be coupled with the floating-gate 112 of a corresponding transistor 103, while the second terminal 133 of the capacitor 127 may be coupled with the output 121 of the corresponding row programming switch 115. Accordingly, each floating-gate 112 of each transistor 103 within a specific row may be in communication with the output 121 of the corresponding row programming switch 115 via a capacitor 127.

The floating-gate transistor array 100 may additionally include a plurality of source lines 136, such that a source line 136 exists for each row of transistors 103. The source 106 of each transistor 103 within a specific row may be coupled to the corresponding source line 136, thereby connecting all of the sources 106 of the transistors 103 within a row.

A ramp generator 142 adapted to provide a voltage pulse or ramp may be incorporated within the floating-gate transistor array 100. The ramp generator 142 includes an output 145 that connects to the input of each row programming switch 115. The voltage pulse provided by the ramp generator 142, therefore, may be provided to selected rows of transistors 103 within the floating-gate transistor array 100. The ramp provided by the ramp generator 142 may be utilized by the saturation programming method (as described more fully below) or sometimes by a rough programming method used to move the device into a proper programming range. Alternatively, an external ramp generator 142 may be used to supply a voltage pulse to the array 100.

An external voltage source, such as the voltage applied to the drain 109 of the transistor 103 (i.e., $V_D$), includes an output 139 coupled with the input of each column programming switch 118. Providing a pulse to this output 139 line is the usual method of programming, when given a fixed source voltage 106 and gate voltage 121. Accordingly, the drain 109 for each transistor 103 may be pulled to the external voltage source for selection purposes during programming (as described below).

The present invention provides for programming a single floating-gate transistor 103, a whole row or column of floating-gate transistors 103, or a subset of floating-gate transistors 103 within a row or column. For exemplary purposes only, to select a single floating-gate transistor 103A for programming (as shown in FIG. 1), the row selection switch 115B having an output 121B coupled with the desired floating-gate transistor 103A is activated. Also, the column selection switch 118A having an output 124A coupled with the desired floating-gate transistor 103A is activated. The point where the output 121A of the row selection switch 1115B intersects with the output 124A of the columns selection switch 118A is the location of the desired floating-gate transistor 103A within the array 100.

In another example using FIG. 1, a complete row of floating-gate transistors 103C, 103D may be selected for programming by activating the row selection switch 115A corresponding to the row desired for programming. Alternatively, a complete column of floating-gate transistors 103B, 103D may be selected for programming by activating the column selection switch 118B corresponding to the column desired for programming.

A subset of floating-gate transistors 103 within a row or column may be selected for programming by first activating the row selection switch 115 or column selection switch 118 corresponding to the row or column including the subset of floating-gate transistors 103. This technique utilizes a combination of the methods described above. Next, a row or column selection switch 115, 118 is activated for every intersection of the selected row or column that represents the location of a floating-gate transistor 103 included in the subset.

Figure 2:
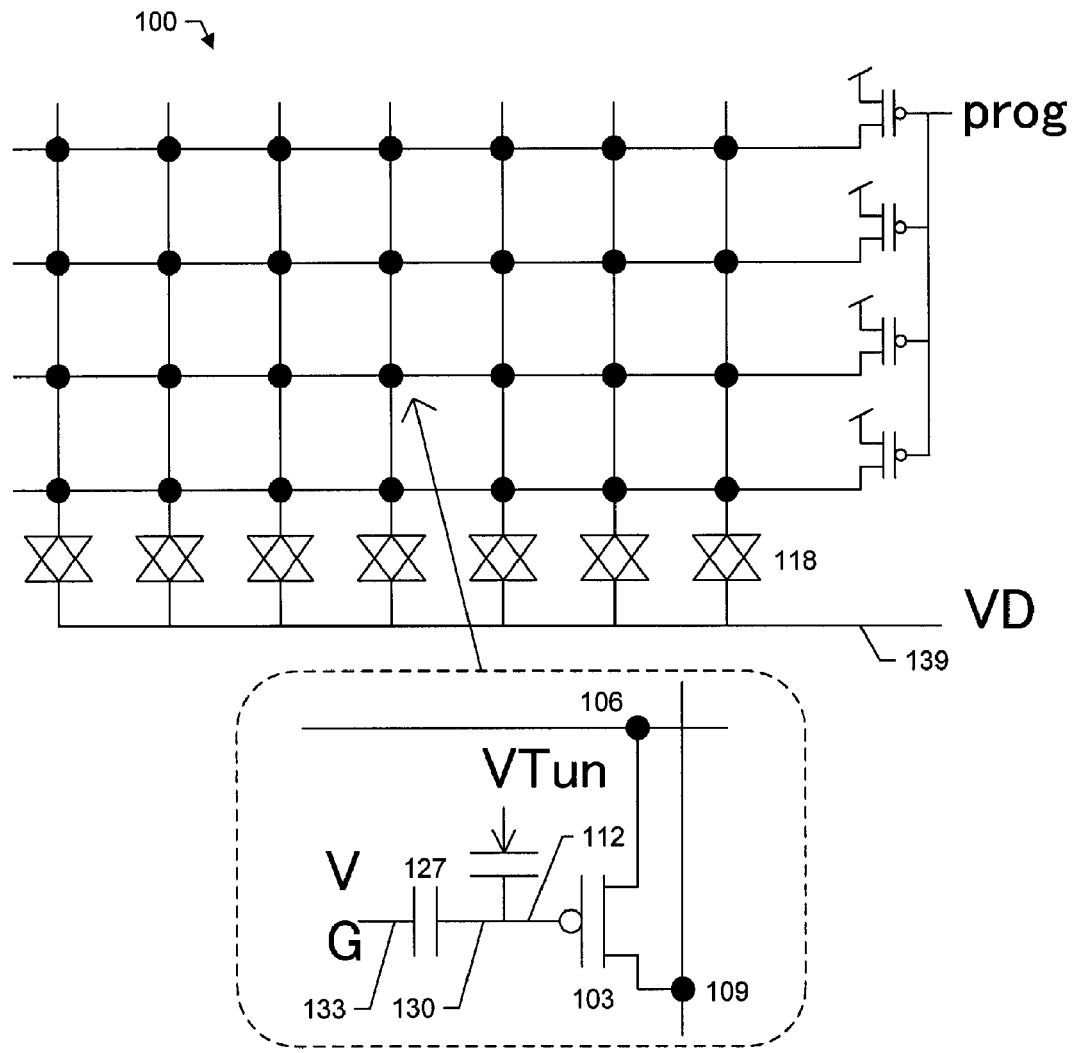
FIG. 2 is a schematic diagram illustrating a floating-gate pFET switch matrix in a crossbar configuration in accordance with an exemplary embodiment of the present invention.

FIG. 2 shows a floating-gate pFET switch matrix in a crossbar configuration utilizing a larger array (e.g., 4×7) than that of FIG. 1. Each node within the array represents a floating-gate pFET 103 that can be selected for programming. Each column of floating-gate pFETs 103 share a common drain line 109, while each row of pFETs 103 share common gate 112 and source lines 106. The drain and source lines 109, 106 are not directly driven during "run" mode, unless explicitly connected to CAB components via the pFET switch elements. Accordingly, any signal driving the source or drain lines 106, 109 of the array are able to propagate through the crossbar switch, limited only by the parasitics of the switches. The gate inputs, shown as $V_G$ in FIG. 2, are all connected to a fixed potential in run mode.

Figure 18A:
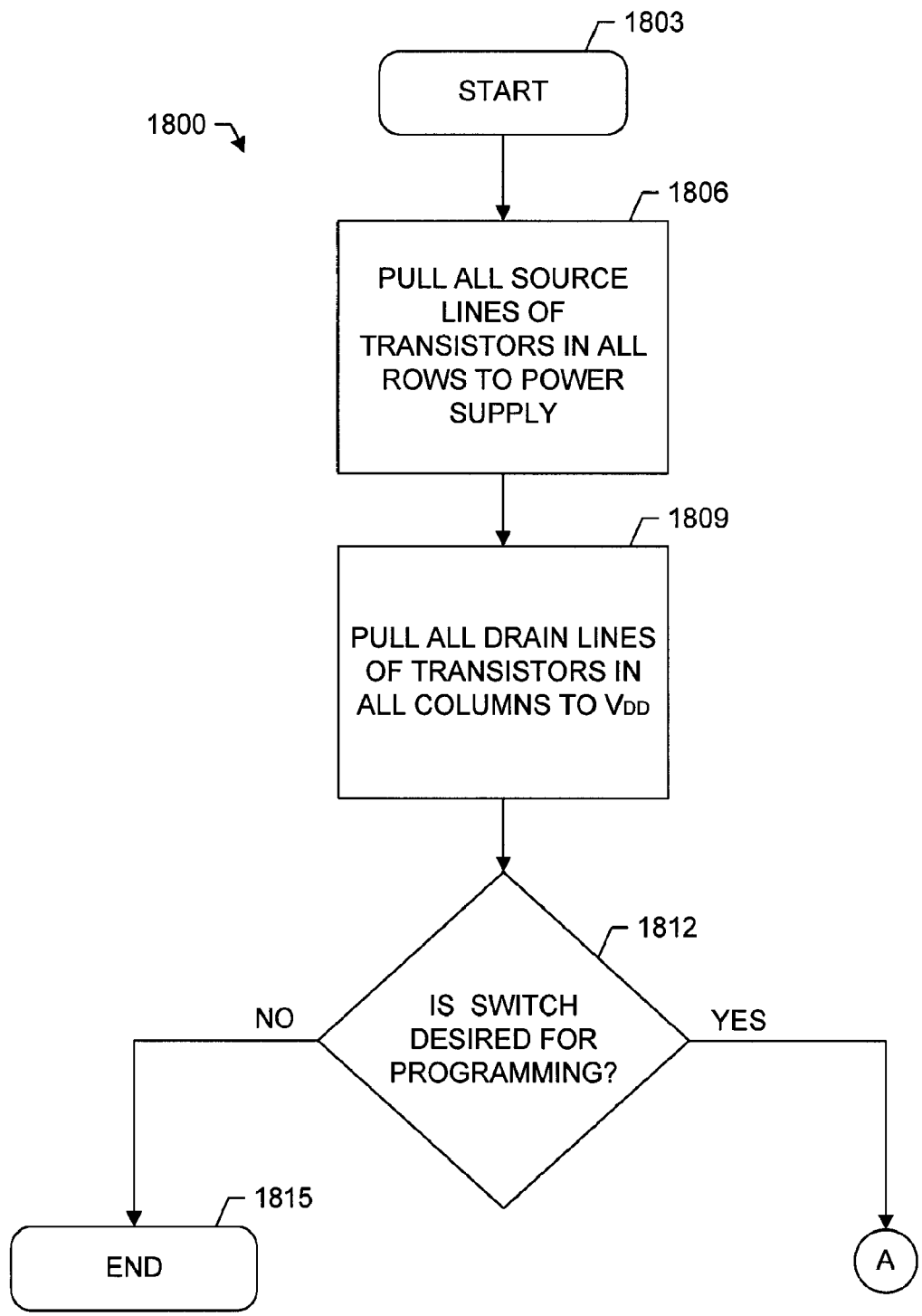
FIGS. 18A-18B, collectively known as FIG. 18, are a flow-chart diagram illustrating a method of selecting and programming a transistor within an array in accordance with an exemplary embodiment of the present invention.
Figure 18B:
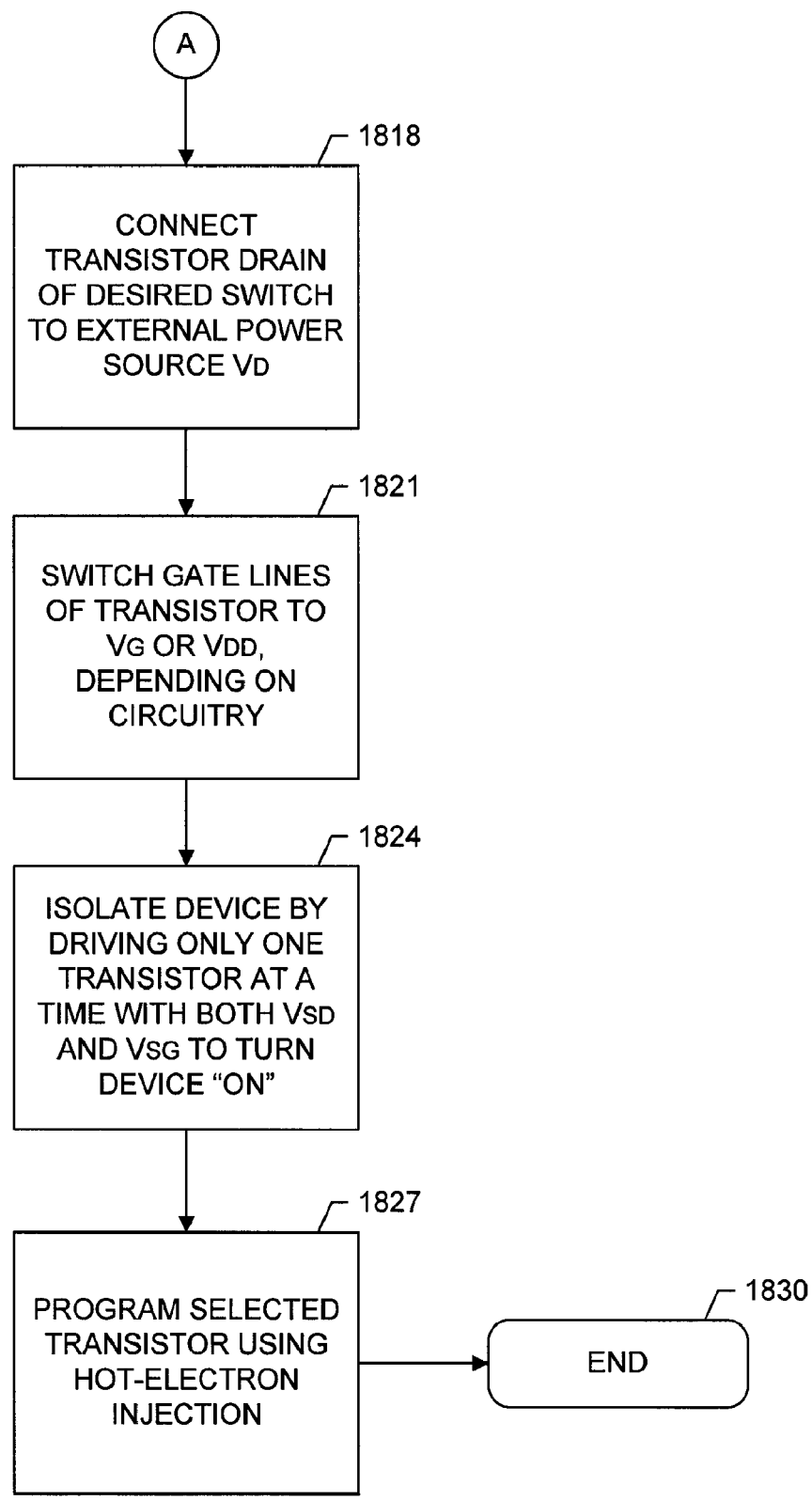

The state in which the charge on the floating-gate pFETs 103 may be modified is referred to as the "programming" mode. FIGS. 18A-18B provide a flow-chart diagram illustrating a method for selecting a transistor 103 within the array for programming. In programming mode, all of the source lines 106 are pulled up to the power supply 1806 by a pFET, as shown in FIG. 2. The drain lines 109 are also pulled up to $V_{DD}$ 1809 by a pFET until selected for programming. If it is determined at 1812 that the switch is desired for programming, then at 1818 the drain line 109 of the switch is connected to an external voltage source 139, such as the drain voltage $V_D$. Next, at 1821, the gate input lines are also switched between an external potential (e.g., the gate voltage $V_G$) and $V_{DD}$, depending upon the selection circuitry used for programming.

An important first step in injecting floating-gate pFET arrays is device isolation. At 1824, device isolation is achieved by driving only one pFET 103 at a time with both the source-drain voltage ($V_{SD}$) and the source-gate voltage ($V_{SG}$) necessary to turn the device "on". Next, at 1827, the transistor 103 of the selected switch may now be programmed using hot-electron injection. Given this architecture, isolation may be maintained until the conduction level of any pFET 103 along the column exceeds that which can be shut-off by connecting the gate input voltage to $V_{DD}$.

In order for a device to serve as a viable element in a cross bar switch network, it should typically have at least two distinct states: an "on" and an "off" state. The ideal switch is characterized by an "on" state having zero impedance and an "off" state having infinite impedance. For practical switches, however, the "on" state is typically characterized by a small impedance between the switch terminals. In the "off" state, the switch has a very high impedance and ideally should not conduct. With respect to a switch implemented as a single MOS transistor, the source 106 and drain 109 of the transistor 103 are the switch terminals. As a result, a non-zero "on" resistance and a finite "off" resistance will occur. The quality of the switch is then determined by those resistances. For an ordinary MOS transistor, this limit is a result of the voltages that may be applied to the gate terminal of the device. A floating-gate transistor's switch quality, however, may be improved by adjusting the charge on the floating node.

Figure 3:
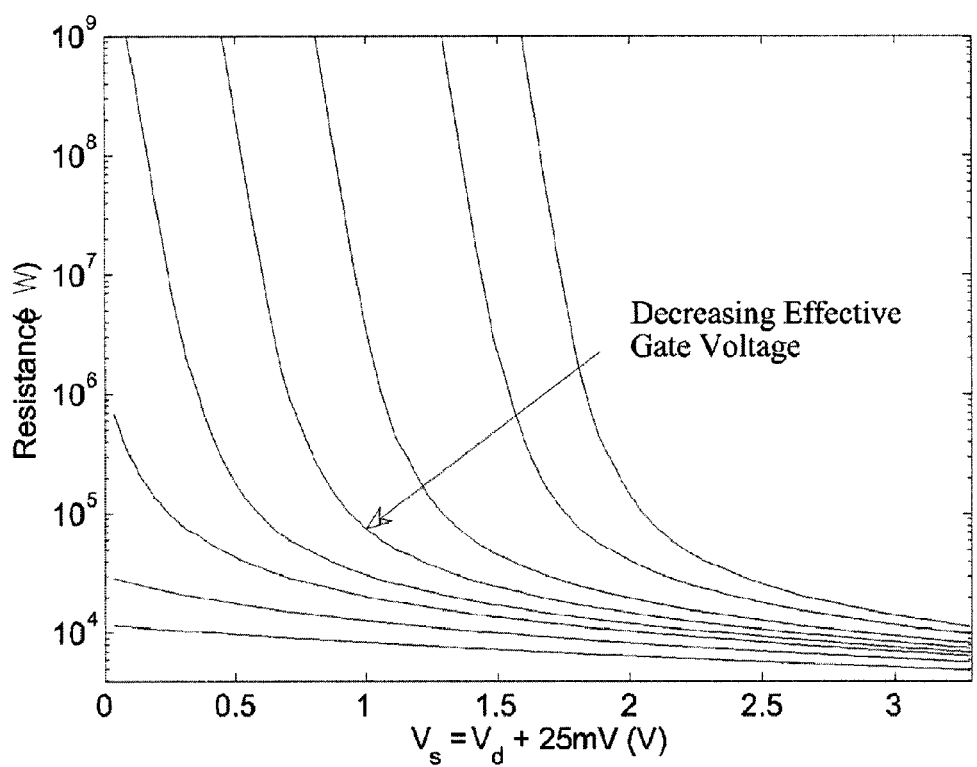
FIG. 3 is a chart illustrating resistance measurements of a floating-gate switch for different levels of hot-electron injection in accordance with an exemplary embodiment of the present invention.

FIG. 3 provides a chart illustrating resistance measurements of an exemplary floating-gate switch for different levels of hot-electron injection. One skilled in the art will recognize that the resistance measurements may vary depending on the quality of the floating-gate switch and, therefore, the chart in FIG. 3 is used to provide a better understanding of the invention, without limiting the scope of the invention. Throughout this disclosure various charts and graphs are used to illustrate various attributes of the various exemplary embodiments. These charts and graphs are provided to help describe the theories underlying the present invention and to show sample results achieve by the exemplary embodiments. The charts and graphs are not intended to limit the present invention in any way.

The "on" resistance of the switch may be varied by several orders of magnitude over the operating voltage of the system. For each curve, the $V_{SD}$ may be held fixed to 25 mV as the source 106 is swept from 25 mV to 3.3 V. The current flowing through the drain 109 may be recorded and used to calculate the resistance as $R=V_{SD}/I_D$. Each curve of FIG. 3 represents a different injection level of the same floating-gate pFET 103. The curve where the resistance is the lowest generally correlates to the highest level of injection. In order to quantify the movement of the resistance curve, the effective gate voltage may be approximated using the following ohmic transistor I-V relationship:

$$I=K\cdot((V_{DD}-V_G)-|V_{th}|-(V_{DD}-V_S)) \quad (1)$$

The lowest resistance curve is associated with an effective gate voltage of nearly −3 V. The negative potential is significant in that it is outside the supply range of the chip. By achieving such a low effective gate voltage, the switch may be turned on much harder (e.g., with a high effective gate voltage) than is possible without injection. The basic principle defining the movement of the resistance curve is a gate modulation effect; as the pFET is injected more, the effective gate voltage decreases, which increases the transistor's 103 conductivity. A secondary effect observed on the resistance curve is the capacitive coupling of the source 106 and drain 109 voltages back onto the floating-gate node 112. At low terminal voltages the effective gate voltage is lowered and at high terminal voltages the effective gate voltage is increased.

Figure 4:
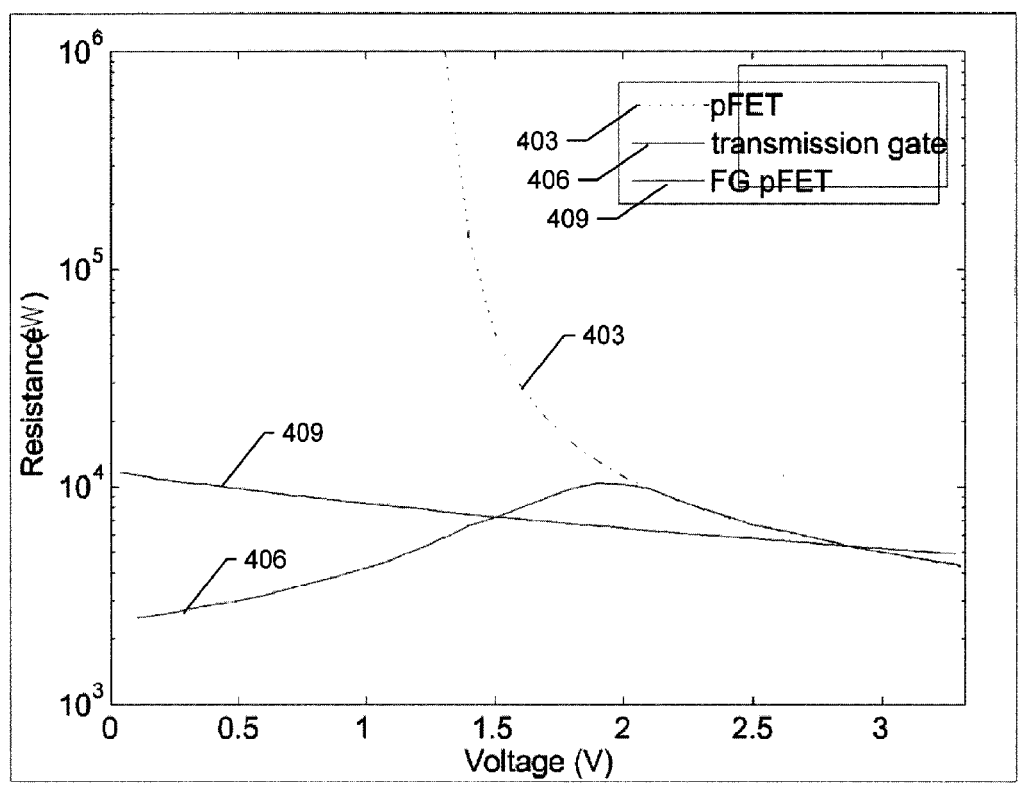
FIG. 4 is a chart illustrating an empirical comparison of "on" resistance of three types of switch elements.

FIG. 4 provides an empirical comparison for the "on" resistance of three different switch elements: a pFET, a transmission gate, and a floating-gate pFET 103. One skilled in the art will recognize that the comparison for the "on" resistance of the three different switch elements is for exemplary purposes only and, therefore, the chart in FIG. 4 provides a better understanding of the invention, without limiting the scope of the invention.

The pFET switch has the least desirable "on" resistance of the three devices, with the non-linear resistance inhibiting the passing of low-voltage signals. The floating-gate pFET 103 has a resistance that is comparable to the transmission gate, accomplished by shifting the resistance curve to the left through injection. The coupling effects of the parasitic drain and source overlap capacitances may also be observed in FIG. 4. Accordingly, using the floating-gate pFET 103 as a switch element has a slightly higher resistance when passing higher voltages than the transmission gate. The change in resistance, however, over the operating voltage range is more consistent in the floating-gate pFET 103 than the transmission gate. Moreover, when placed in the "off" position, the floating-gate transistor has a resistance that exceeds a gigaohm.

A serious limitation to the bandwidth of an FPAA is the parasitic capacitance associated with the switching network. Based upon the architecture and layout of the crossbar network, the capacitance contribution to a drain or source line 109, 106 per switch may be calculated to be approximately 7 fF for an exemplary embodiment using the specified component value. When fully considering the capacitance contributions affecting a routed signal, all of the parasitic capacitances touching the signal line should be summed. In the case of the crossbar switch network, the capacitance contribution for each column is the number of rows multiplied by the parasitic capacitance of a single switch. Accordingly, the capacitance of a row is simply the contribution of a single switch multiplied by the number of columns, which is the number of switches along the row. Based upon this, the floating-gate pFET switch networks should have significantly less parasitic capacitance than a transmission gate based network and therefore be able to achieve higher bandwidths.

Figure 5:
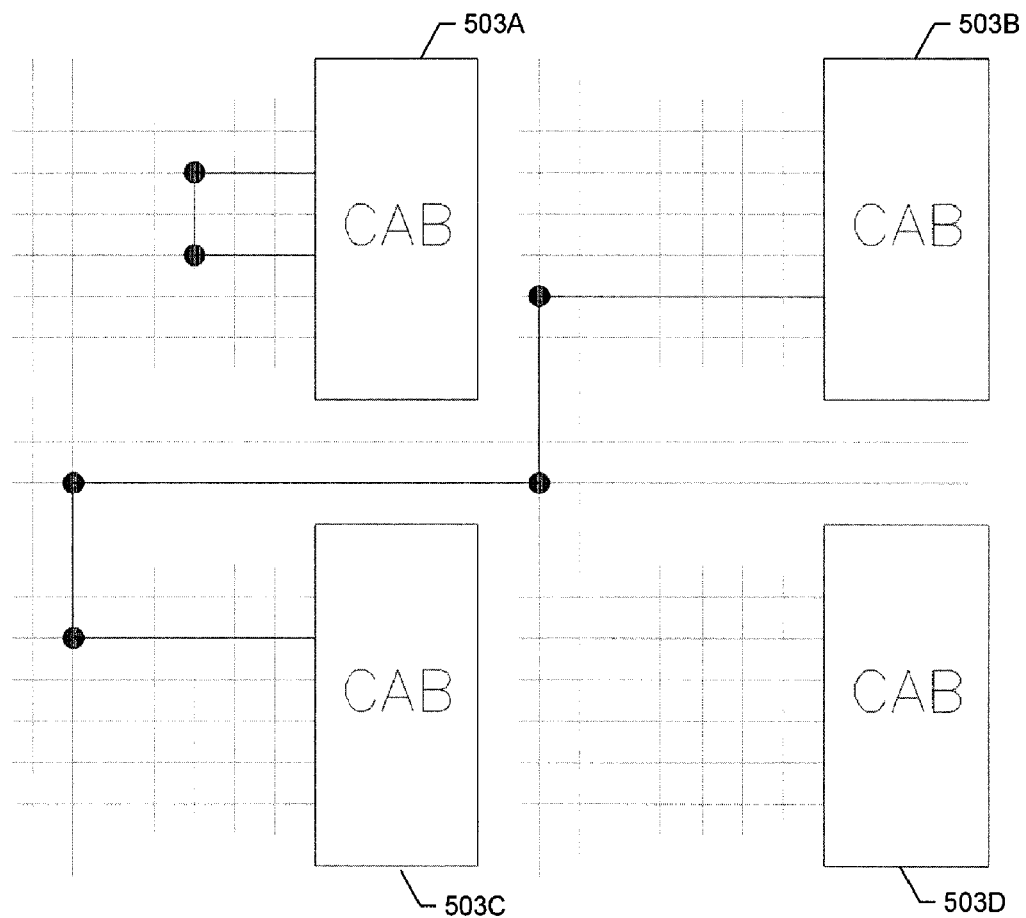
FIG. 5 is a schematic diagram illustrating a typical routing scheme utilized in FPAA crossbar switches.

To better illustrate the effects of this parasitic capacitance, FIG. 5 provides a schematic diagram illustrating a conventional routing scheme utilized in FPAA crossbar switches. Local connections to and from the same CAB 503 may generally be accomplished with a single pair of switches as illustrated in the upper left crossbar network of FIG. 5. Routing between CABs 503 is usually implemented through two pairs of switches, unless the CABs 503 are connected to the same set of vertical global routing lines, in which a single pair of switches may suffice.

Figure 6:
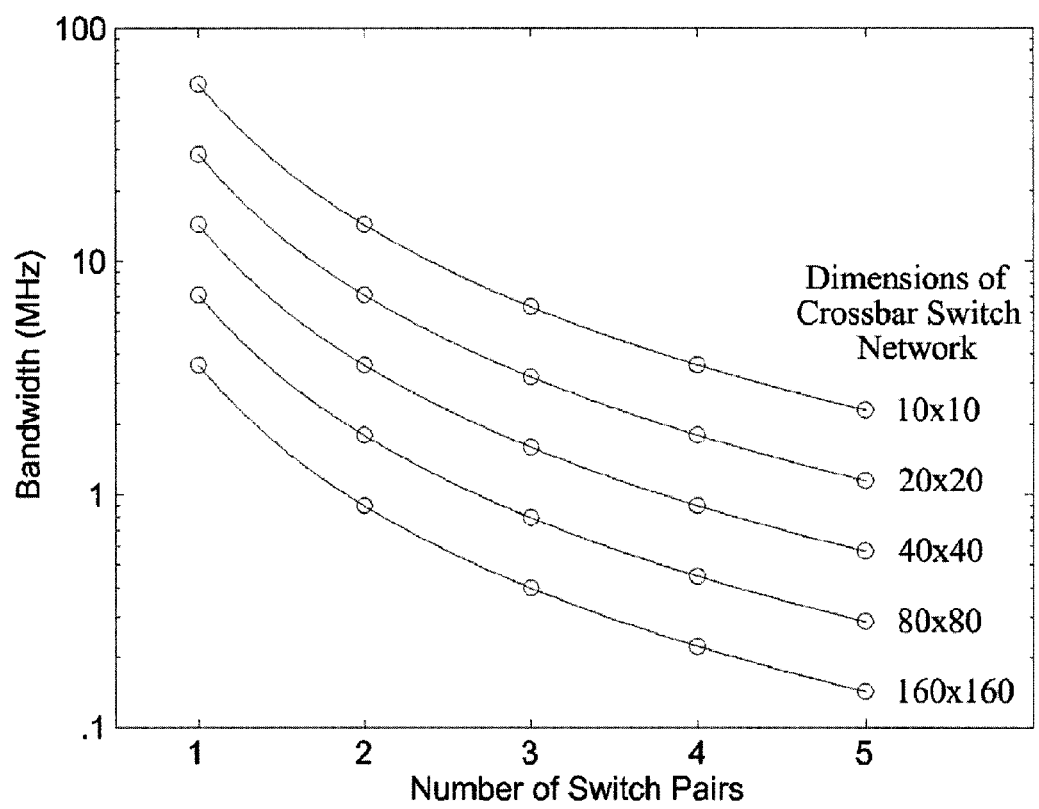
FIG. 6 is a chart illustrating bandwidth measurements for a switch network using different routing lengths and crossbar configurations.

FIG. 6 is a chart illustrating bandwidth measurements for an exemplary switch network using different routing lengths and crossbar configurations. More specifically, FIG. 6 illustrates the effects of the switch network dimensions and routing distance, defined as the number of switch pairs in the signal path, upon the bandwidth of the network. Such a plot uses a lumped model to estimate the effective bandwidth of the network given different routing scenarios. For expanded architectures with higher levels of routing, the routing distances greater than the expected 2 pairs of switches may be examined. For the given 0.5 µm process, the expected bandwidth stays in the megahertz range for most reasonable network dimensions and routing lengths. FIG. 6, however, clearly shows that FPAAs with higher routing levels should have carefully constructed networks to limit the number of switches per signal line in order to balance connectivity with bandwidth.

Hot-electron injection may be used to bias the switch into the "on" position. Referring again to FIG. 2, the transistors 103 that make up the crossbar switch may have impedances located at the sources 106 and drains 109 resulting from the required transmission gates used to isolate a specific device during programming.

Figure 7:
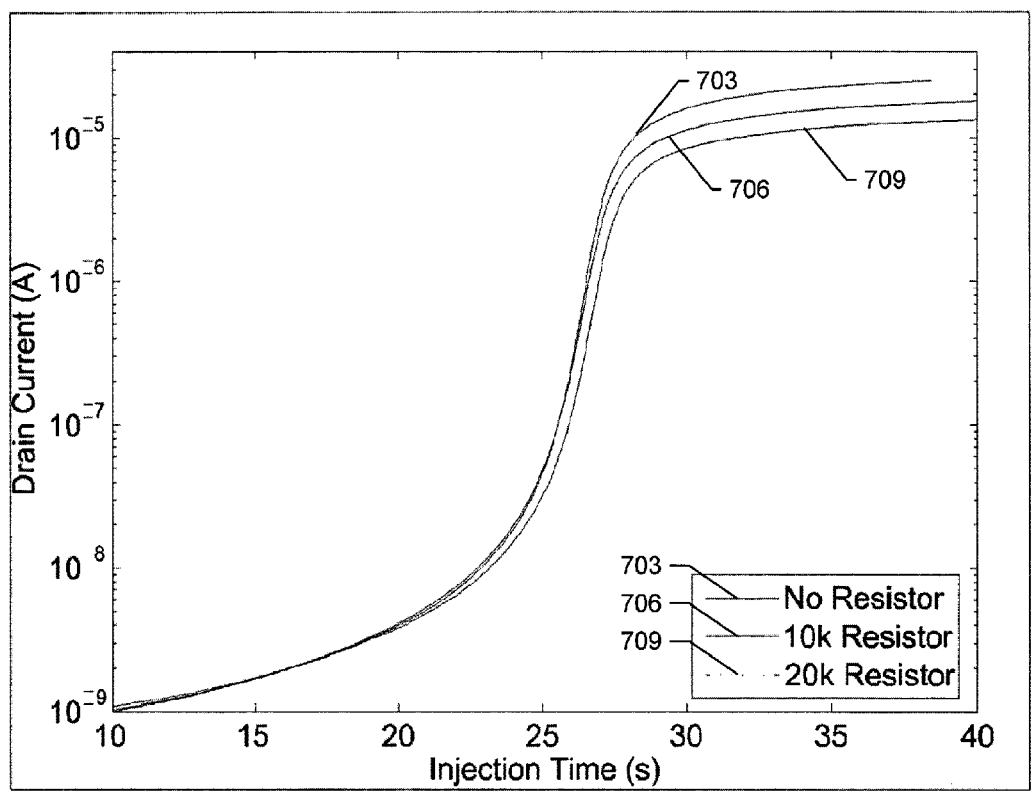
FIG. 7 is a chart illustrating drain current measurements of a floating-gate pFET during hot-electron injection in accordance with an exemplary embodiment of the present invention.

The implication of those transmission gates is highlighted in the exemplary chart provided by FIG. 7. The chart illustrates drain current measurements of an exemplary floating-gate pFET during hot-electron injection. One skilled in the art will recognize that the data provided by FIG. 7 is for exemplary purposes only and, therefore, the chart in FIG. 7 is used to provide a better understanding of the invention, without limiting the scope of the invention.

A single, isolated floating-gate pFET 103 may be injected over a period of about 40 seconds with a $V_{SD}$ of 5.5 V. This source-drain voltage ($V_{SD}$) may be chosen to provide a measurable injection current. The device may be tunneled and then injected with a discrete 10 kΩ resistor placed between the drain node and the voltage source for the drain 109. The experiment may be repeated for a 20 kΩ resistor. The introduction of resistors represents the possible worst case parasitic resistance due to a transmission gate. The addition of resistors may result in a lower drain current, implying that the injection may be limited. From the injection equation, $$I_{inj} = I_{inj0}\left(\frac{I_S}{I_{SO}}\right)^\alpha e^{-V_{SD}/V_{inf}}, \quad (2)$$

it is shown that the injection may be partly controlled by $V_{SD}$. As the current through the drain 109 increases, the voltage dropped across the resistor increases. At 25 mA, the drop across the resistors is nearly 5% to 10% of the $V_{SD}$ voltage for the 10 kΩ and 20 kΩ resistors, respectively. With a 5% to 10% decrease in the $V_{SD}$, the rate of injection is expected to decrease exponentially.

Figure 8:
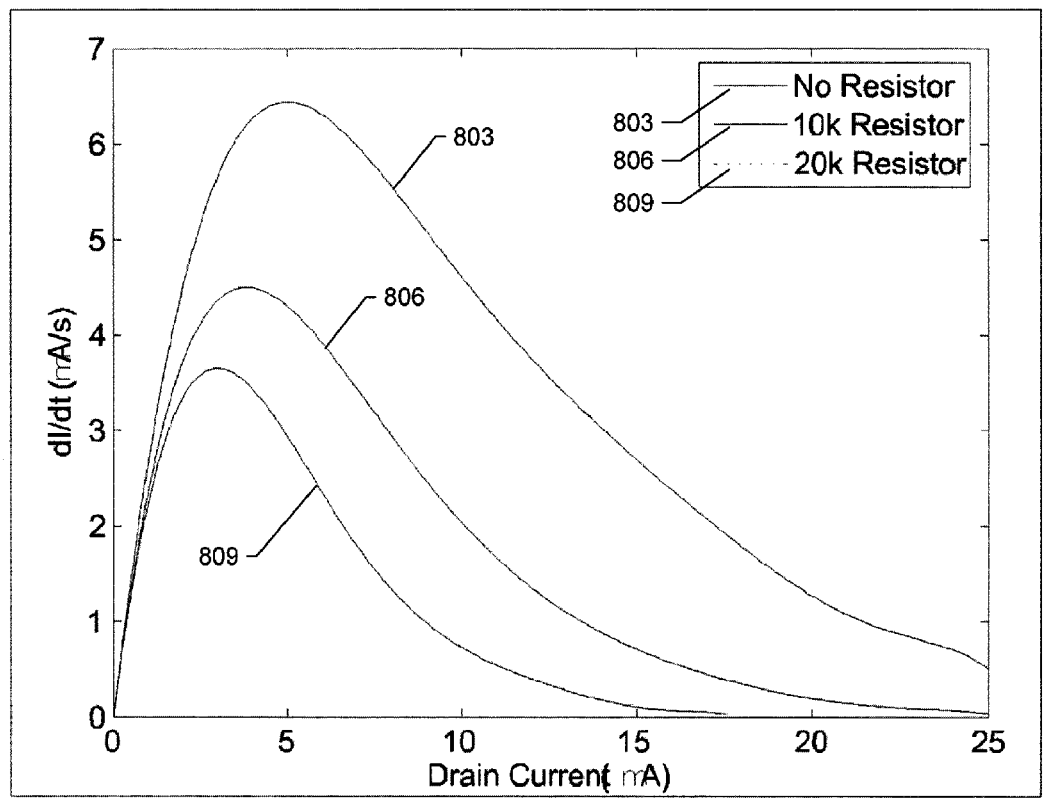
FIG. 8 is a chart illustrating rate of injection measurements for a floating-gate pFET in accordance with an exemplary embodiment of the present invention.

By performing a numerical differentiation on the data from FIG. 7, the rate of injection may be determined. FIG. 8 provides a chart illustrating rate of injection measurements for an exemplary floating-gate pFET. Again, the data in the chart is provided for understanding the invention, not limiting the invention. Plotted against the drain current, the relationship between channel current and injection is clear; injection and the subsequent rate of injection are highly dependent on the channel current.

The longer the device is injected, the more the channel current increases. In a situation where a high level of injection is desired, the channel current should constantly be reduced in order to facilitate continued injection at a desired rate. A convenient method of modulating the channel current is accomplished by moving the gate input voltage. Accordingly, a floating-gate pFET 103 may be injected into the "on" state by increasing the gate input voltage over time, while providing the necessary $V_{SD}$, thereby limiting the amount of current flowing through the channel.

One of the major limitations of injection in the array structure is that in order to get the negative effective gate voltage necessary to reduce the switch resistance to the level of a transmission gate, isolation can not be maintained with the given architecture. If a switch has been programmed to an effective gate voltage of −3 V when selected, the deselected device will have an effective gate voltage of approximately 0 V. This results in a $V_{SG}$ much greater than the threshold voltage of the device. Therefore, the switch can no longer be turned "off" by means of applying $V_{DD}$ to the floating-gate pFET's 103 input capacitor. Once a switch has been programmed to the "on" state, a fixed amount of current will flow through the shared drain line 109 even if the device is not selected.

In order to achieve the routing necessary to implement the desired circuits, multiple switches need to be turned "on" in the same column. As already described, the transmission gates present in the array of floating-gate devices 103 have a significant resistance which will limit the injection of a single switch. In the case of turning on a second switch in a column, the situation is exacerbated by the current that flows through the unselected switch already injected to the "on" state. Various ICs have 100 μA to 200 μA of current that flow through an "on" switch that is unselected. The resulting drop in $V_{SD}$ may be on the order of a volt or more. As a result, switches should not be turned on sequentially in a column without isolation.

In order to turn on multiple switches in a column and maintain the same "on" resistance across the switches, the pFETs 103 should be injected at the same time. In an exemplary embodiment of the present invention, the decoder structure limits selection to a single switch at a time, so an interleaved injection method should be used as an approximation. For a given gate voltage, the first switch to be injected on a drain line 109 is injected for a short time, from tens to hundreds of microseconds. Then, the next switch in the column is selected and injected for the same short time span. Once all the switches have been exposed to the pulse injection, the gate voltage is raised by some amount, typically on the order of a millivolt, and the process is repeated. Because the injection time is short, the increase in current through the switch is small, resulting in a small change in the voltage drop across the resistor. Accordingly, all the switches being injected in the column see nearly the same $V_{SD}$ for a given gate voltage.

To further simplify the circuitry of the FPAA crossbar switch network, while providing advantages in programming, the present invention introduces a non-invasive method of programming (referred to herein as "indirect programming") a floating-gate transistor 103, which eliminates the need for disconnection of the floating-gate transistor 103 from a circuit. One skilled in the art will recognize, however, that the proposed method of indirect programming may be used in other circuitry configurations using floating-gate transistors 103 and, therefore, is not limited to application with FPAA crossbar switch networks.

Indirect programming provides runtime programming capabilities without the need for isolating the transistor 103 from the circuit, thereby eliminating the need for isolation switches. Further, the operational transistor 103 may be free from any programming components, as all programming components are associated with the programmer transistor 103, which is coupled to the operational transistor 103 via a common floating-gate 112. The present invention, therefore, provides for programming a particular transistor 103 without stopping the flow of data on the operational circuitry.

Indeed, indirect programming may greatly reduce the need for direct programming circuitry (e.g., 2-to-1 multiplexers for every floating-gate to be programmed), thereby reducing the size of the silicon footprint necessary to implement the circuitry. As the transistor 103 does not need to be disconnected from the circuit during indirect programming, the switch count is reduced, resulting in fewer parasitics and better overall performance. The use of these indirectly programmed floating-gate transistors 103 allows a circuit to be tuned such that the effects of any device mismatch are substantially negated. Further, by using a variation of indirect programming, a circuit may be recalibrated while it is still operating within the system (e.g., during run-time).

The present invention also provides a unique method of programming the transistor 103 by utilizing saturation techniques, instead of conventional pulse and measure methodology. Conventional hot-electron injection requires pulsing of the transistor 103 with a drain voltage for a short period of time and then measuring the programmed current to determine if the desired current has been reached. Such a process is slow and requires isolation of the transistor 103, thereby removing it from the operational circuitry. The present invention, however, uses the relationship between the gate voltage and the saturation point of the transistor 103 to accurately program the desired current to the programmer transistor 103. As the programmer transistor 103 and the operational transistor 103 share a common floating-gate 112, the operational transistor 103 is also programmed to the desired current, automatically. Advantageously, the present invention allows for run-time programming of the operational transistor 103 (indirectly) without the need to disconnect the transistor 103 from the operational circuitry, while additionally providing a rapid programming process.

FIGS. 9A-9D provide schematic diagrams illustrating a programming structure for a floating-gate transistor 103 utilizing direct and indirect programming techniques. More specifically, FIG. 9A provides the programming structure of a pFET indirectly programming another pFET, FIG. 9B provides the programming structure of a pFET indirectly programming an nFET, FIG. 9C provides the conventional circuitry for directly programming a pFET, and FIG. 9D provides the conventional circuitry for directly programming an nFET. Comparing FIGS. 9A with 9C and 9B with 9D, an obvious reduction in T-gates is realized.

To effectuate indirect programming, multiple MOSFETs may be coupled to a common floating gate 112, such that a first transistor 103 ($M_p$) is connected to a programming structure, while the source 106 and drain 109 of a second transistor 103 ($M_a$) are connected to a respective operational circuit, as shown in FIGS. 9A-9B. Generally, the first transistor 103 is programmed using hot-electron injection and tunneling. Through indirect programming, modification of the charge on the floating-gate 112 and the current through the first transistor 103 (the "programmer") causes the charge on the floating-gate 112 and the current through the other transistor 103 (the "agent") to also be modified.

Figure 10A:
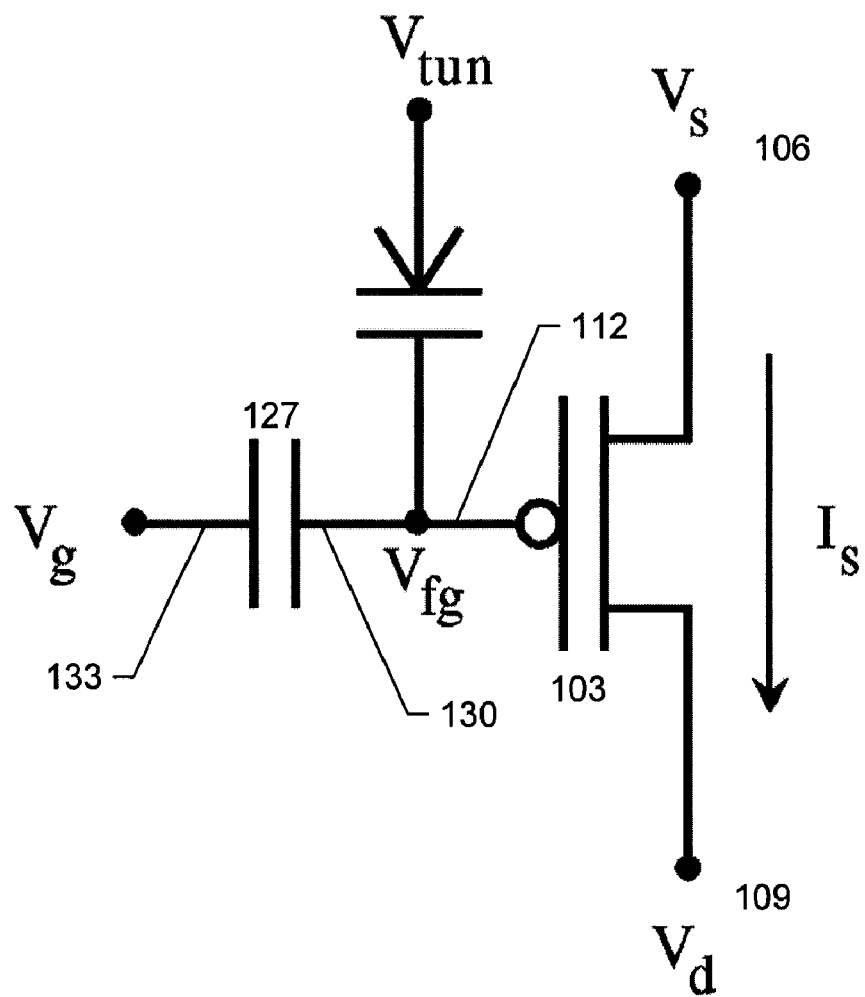
FIGS. 10A-10D, collectively known as FIG. 10, are schematic diagrams and charts illustrating circuitry and measurements of floating-gate transistors, including a single floating-gate transistor, an array of floating-gate transistors, a measurement of threshold voltage during injection and tunneling, and a measurement of accurate programming with an array of floating-gate devices in accordance with an exemplary embodiment of the present invention.
Figure 10B:
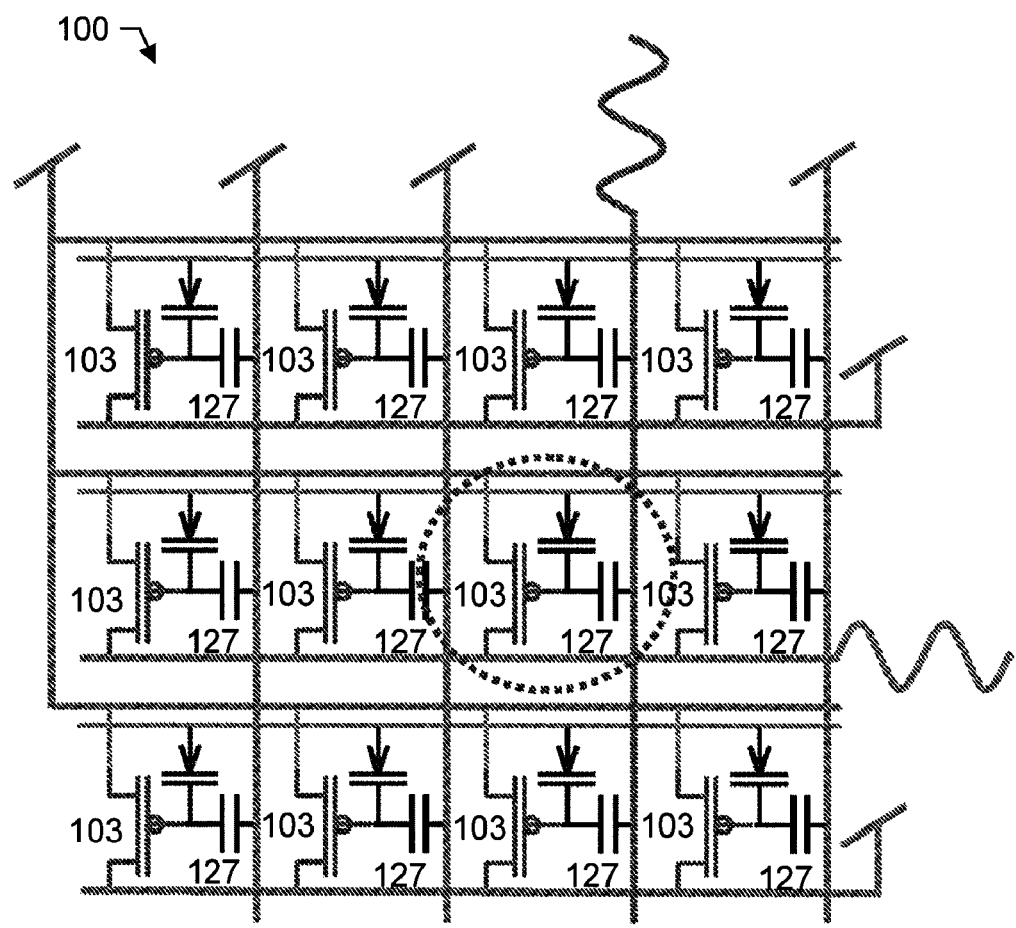
Figure 10C:
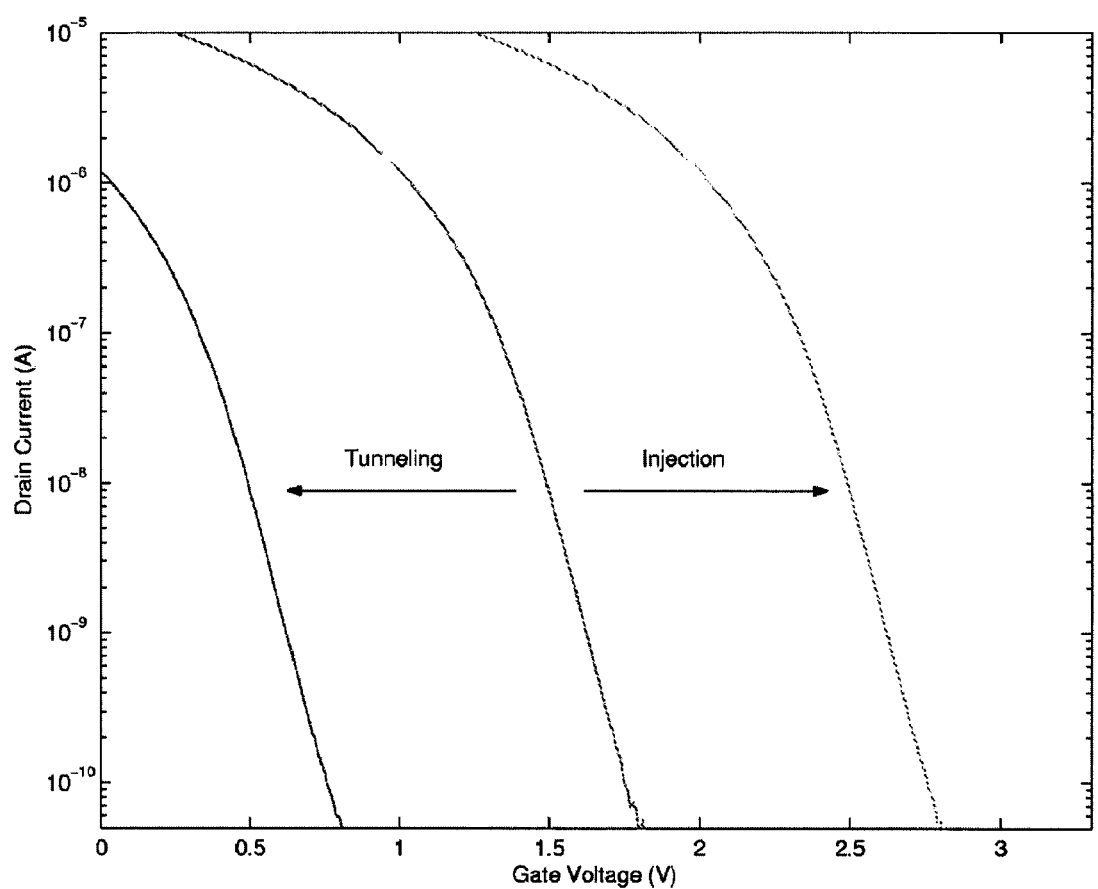
Figure 10D:
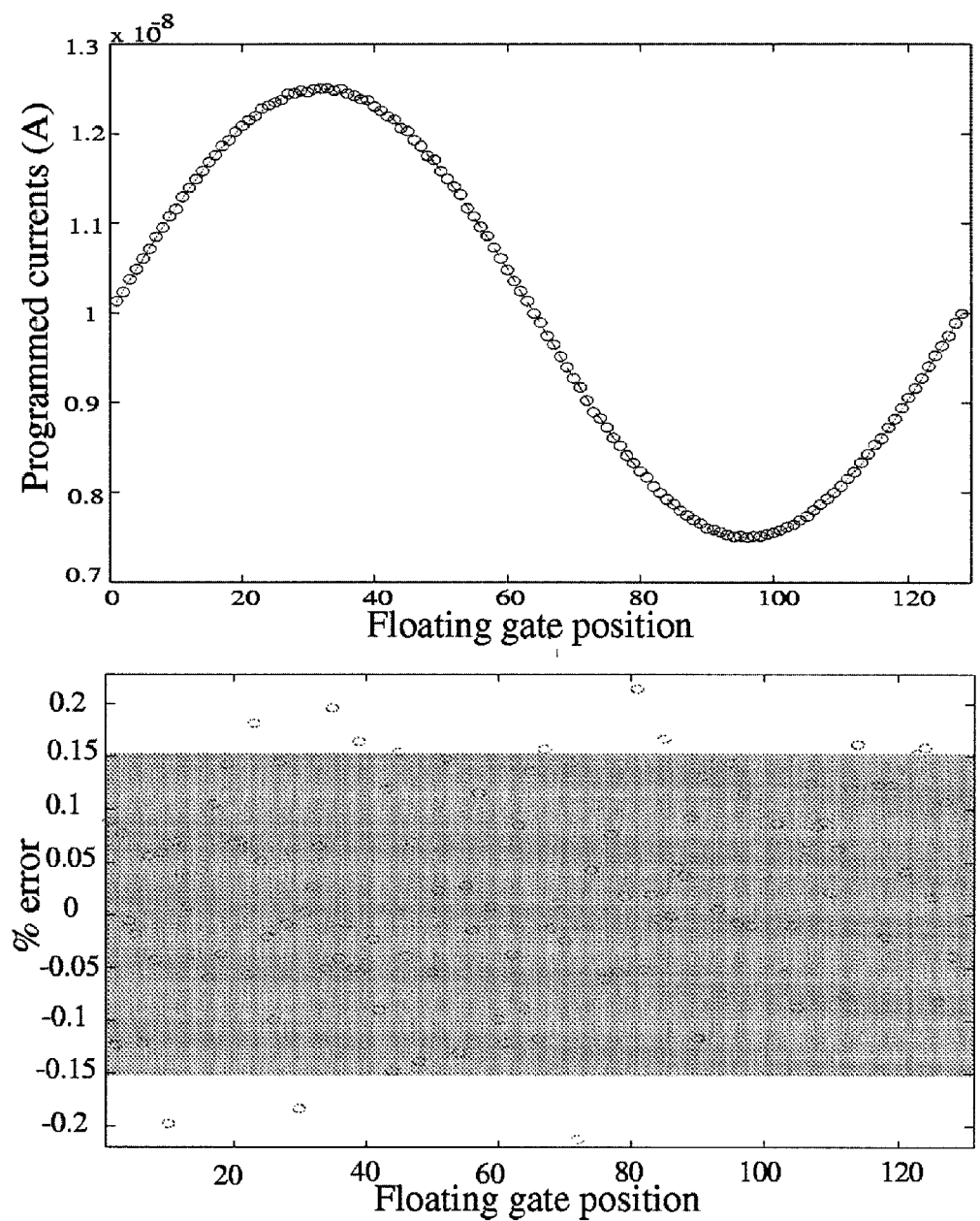

In order to provide an overview of floating-gate transistors 103, FIG. 10 provides a schematic of a single floating-gate transistor 103 (FIG. 10A), a schematic of an array of floating-gate transistors 103 (FIG. 10B), a chart of threshold voltage movement based on tunneling and hot-electron injection (FIG. 10C), and charts of the floating-gate position based on accurate programming with an array of floating-gate devices (FIG. 10D). One skilled in the art will recognize that the data provided in FIGS. 10C-D are for better understanding the invention, but not for limiting the invention.

Each floating-gate transistor 103, as shown in FIG. 10A, may be a standard MOSFET device with only capacitors 127 connected to the gate 112. The charge on the gate 112 is generally fixed and responsible for establishing the predetermined amount of current flowing through the transistor 103, because the gate 112 is electrically isolated due to encapsulation by oxide. The charge on the gate 112 will not typically change on its own, but the charge may be modified by programming processes such as, but not limited to, ultraviolet photo injection, Fowler-Nordheim tunneling, and hot-electron injection. Primarily, indirect programming utilizes Fowler-Nordheim tunneling and hot-electron injection for precisely setting the current of a floating-gate transistor 103.

Using electron tunneling, for example, a large voltage is placed across a MOS capacitor. As the tunneling voltage is increased, the effective width of the barrier decreases, thereby permitting electrons to breach the gap without adversely affecting the insulator of the floating-gate transistor 103. Consequently, tunneling may be used to remove electrons from the floating-gate transistor 103 in a controlled manner and, thus, raises the effective threshold voltage (referenced to $V_{dd}$), as illustrated in FIG. 10C.

Hot-electron injection, for example, may be used to add electrons to the floating-gate transistor 103 in a similarly controlled manner. For optimized hot-electron injection, an appreciable amount of current should be flowing through the device, whereby a large source-to-drain voltage is placed across the transistor 103. At this point, holes in a pFET flowing through the channel can build-up sufficiently large energy to ionize an electron-hole pair. The resulting electron may have enough energy to pass through the insulator and onto the floating-gate transistor 103, thereby increasing the number of electrons on the gate 112, which effectively lowers the threshold voltage. As n-channel devices (e.g., nFETs) in current IC proceseses use process-control parameters to reduce the injection of electrons, only p-channel devices (e.g., pFETs) are practical for floating-gate programming during indirect programming, because pFETs have a higher injection efficiency.

Generally, floating-gate transistors 103 may be arranged in an array 100, so that a large number of floating-gate devices may be programmed easily and selectively, as illustrated in FIG. 10B. Hot-electron injection allows for complete selectivity of an individual element and, therefore, may be used for precise and accurate programming of floating-gate arrays 100. Tunneling, however, does not easily provide for selectivity and is, consequently, reserved for globally "erasing" the charges stored on the floating gates 112.

In order to select a particular device in the array shown in FIG. 10B for hot-electron injection, all the drain lines 109 of the unselected rows are connected to $V_{dd}$, while all gate lines of the unselected columns are also connected to $V_{dd}$. To program a single device, one would select the row and column of the desired device. To program more than one device, an entire row or column may be selected; an entire row and particular columns may be selected; or an entire column and particular rows may be selected. As illustrated in FIG. 10D, the use of this array programming scheme achieves a high-degree of programming accuracy.

The use of hot-electron injection for programming, however, is not constant over all current ranges. To achieve the highest efficiency for hot-electron injection, the present invention provides for indirect programming using subthreshold currents. While injection of floating-gate transistors 103 can be effective for above threshold current levels, hot-electron injection is more often effective when coupled with lower current levels (and hence reduced power consumption). Although the present invention, as described below, focuses primarily on the operation of indirect programming with subthreshold current levels, one skilled in the art will recognize that the same concepts may also be applied to above-threshold current levels.

Figure 11A:
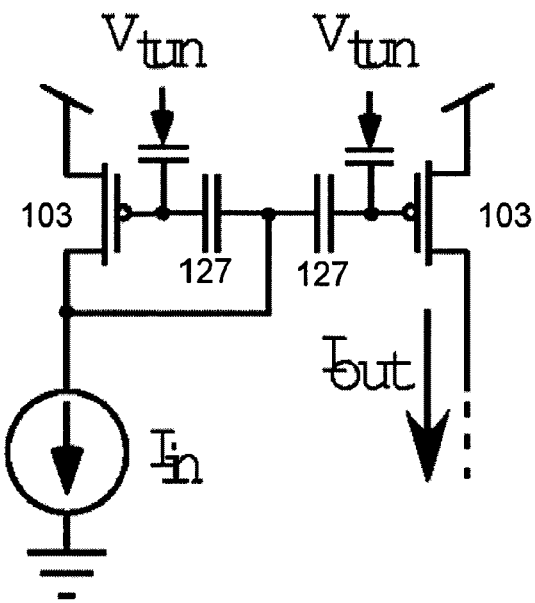
FIGS. 11A-11F, collectively known as FIG. 11, are schematic diagrams and charts illustrating various circuitry used for direct and indirect programming techniques and associated measurement data in accordance with an exemplary embodiment of the present invention.
Figure 11B:
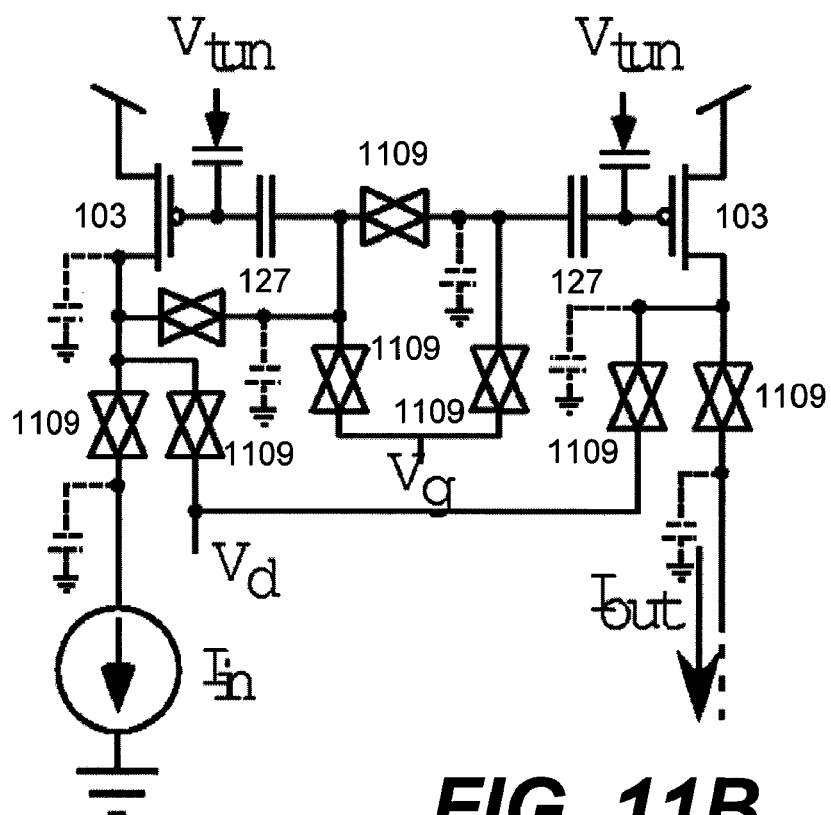

To provide a better understanding behind the motivation for indirect programming, the usefulness of indirect programming should be examined. FIG. 11A provides a schematic diagram of floating-gate transistors 103 for offset removal in a current mirror. To allow complete disconnection during programming of each floating-gate transistor 103 of FIG. 11A, conventional direct programming techniques introduce many T-gate switches which add parasitic capacitances and resistances. The resulting pFET floating-gate current mirror using direct programming is illustrated in FIG. 11B.

The additional switches increase the required area and supply headroom, while concurrently degrading the operational performance of the current mirror. The increased complexity is clearly evident using conventional methods of programming, due to the numerous isolation switches needed for programming. Specifically, in order to break the floating-gate transistors 103 (FIG. 11A) out of the mirror for conventional programming, additional resistances and capacitances must be introduced through the use of eight T-gates 1109. These additional resistances and capacitances seriously hamper the performance of the current mirror, especially at high frequencies. For programming purposes, the simple two-transistor current mirror becomes a complex 18-transistor circuit.

Figure 11C:
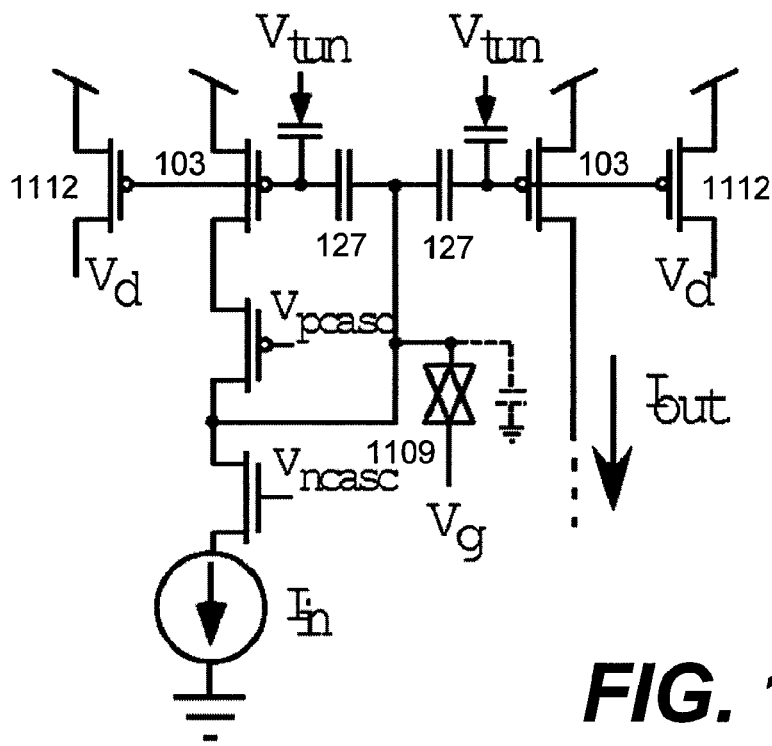

As illustrated in FIG. 11C, the use of indirect programmed transistors greatly reduces the complexity of the circuitry for the pFET floating-gate current mirror (as compared to direct programming) and, therefore, minimizes parasitics. Only a minimal amount of isolation switches need to be included. Further, the circuit may be implemented using only two cascoding transistors 1112 and a single T-gate 1109, with the cascoding transistors 1112 serving the dual purpose of isolating the floating-gate transistor 103 and enhancing the current response of the mirror.

Implementation of an nFET floating-gate current mirror is virtually impossible using direct programming due to the process-control techniques that specifically work to avoid nFET injection in current IC processes. When an nFET is to be used as a precise current source with floating-gates, a pFET may be programmed with a current, which is then mirrored into the nFET current source, as shown in FIG. 9D. Creating a programmable nFET current mirror with the direct method of programming, however, is not a simple task.

Figure 11D:
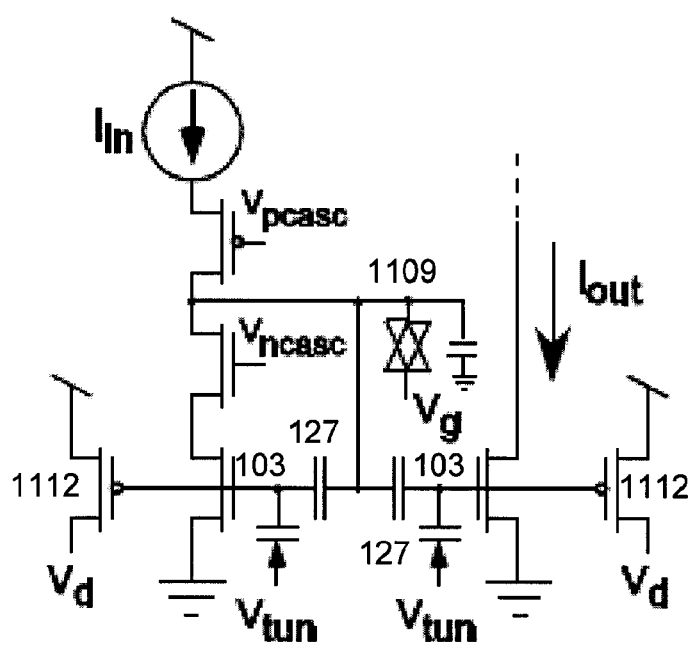

Using indirect programming, however, the current mirror design is a simple design as illustrated by FIG. 11D. Indeed, the process of programming an nFET is more explicit with indirect programming. The nFET current may be set by programming the pFET, because the nFET and pFET share the same floating gate 112. This technique permits the construction of a programmable nFET current mirror, as illustrated in FIG. 11D, that is completely analogous to the pFET version shown in FIG. 11C. The benefits of utilizing not only a floating-gate programmable current mirror, but also one using indirect programming are evident in FIGS. 11E-11F. For exemplary purpose only, the data from these plots was obtained from an nFET version of the programmable current mirror. While data from a pFET version of an indirectly programmed current mirror has generally similar results, the nFET version, which was not previously capable of being built, is provided. Again, the data provided in FIGS. 11E-11F are for understanding the invention, not for limiting the invention.

Figure 11E:
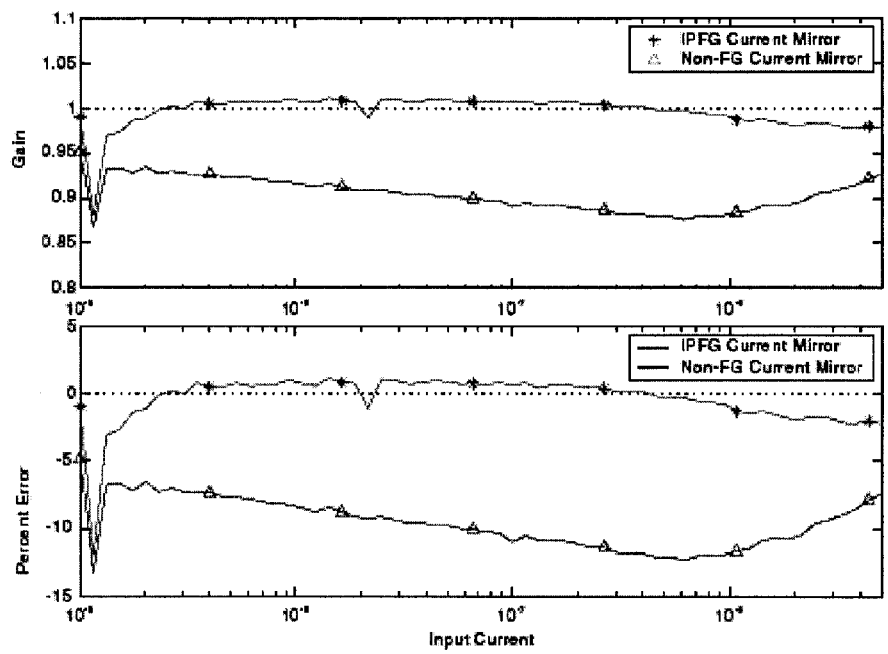
Figure 11F:
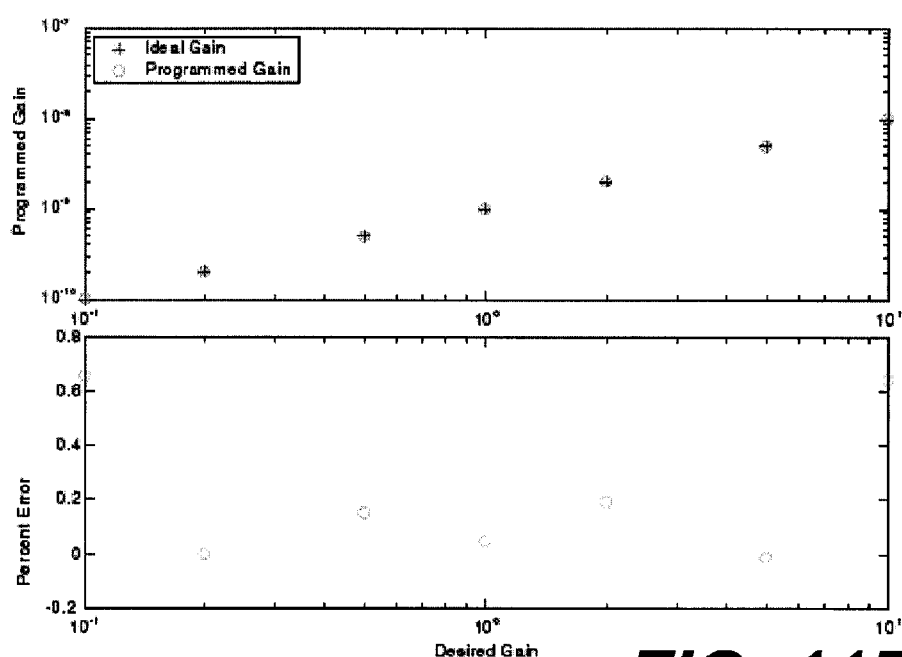

Normalizing the charge on the two floating nodes in the current mirror allows the current mirror to perform very close to ideal, as shown by the results of FIG. 11E. Using identically sized floating-gate transistors 103, the nFET version of an indirectly programmed floating-gate current mirror was constructed. By normalizing the charge on the two floating nodes, identical currents flow through both legs of the indirectly programmed floating-gate current mirror. In saturation, the subthreshold current flowing through a floating-gate transistor 103 is given by $$I = I_0 e^{\kappa V_{FG}/U_T} e^{-V_S/U_T} e^{V_d/V_A}, \quad (3)$$

resulting in a current gain, $I_{out}/I_{in}$, of $$\frac{I_{out}}{I_{in}} = \frac{I_0 e^{\kappa V_{FG,out}/U_T} e^{-V_S/U_T} e^{V_d/V_A}}{I_0 e^{\kappa V_{FG,in}/U_T} e^{-V_S/U_T} e^{V_d/V_A}} = \frac{e^{\kappa V_{FG,out}/U_T}}{e^{\kappa V_{FG,in}/U_T}} \approx 1, \quad (4)$$

assuming that the drains 109 are at similar potentials. In these subthreshold equations, $U_T$ is the thermal voltage, $\kappa$ is the capacitive ratio coupling from the gate to the surface potential, and $V_A$ is the Early voltage.

As illustrated in FIG. 11E, the gain may be made very close to unity by programming identical charges to the two floating nodes. Further, the percentage of error from the input to the output of a standard two-transistor current mirror is approximately 7-10% over a wide range of input currents. Such a degree of mismatch is not unexpected for small-sized transistors $$\left(\frac{W}{L} = \frac{2.4\,\mu m}{1.2\,\mu m}\right).$$

In addition to normalizing the floating-gate charge for a unity-gain current mirror, the indirectly programmed floating-gate current mirror allows the gain to be set after fabrication by programming different charges to the two floating nodes. As illustrated in FIG. 11F, the programming of the current mirror to a variety of gains resulted in gains well within 1% accuracy. While the current gain during saturation allows the indirectly programmed floating-gate current mirror to achieve unity gain over a wide range of current levels, this same relationship will only allow the current mirror to achieve the desired non-unity gains while both transistors 103 stay in the subthreshold range. If, however, a transistor 103 enters moderate or strong inversion, then the exponential relationship of the current no longer holds and the gains will degrade from their programmed values. Accordingly, the baseline current for measurement in FIG. 11 was a subthreshold current (1 nA).

Indirect programming provides several distinct advantages over conventional methods of programming. For example, and not limitation, indirect programming of floating-gate transistors 103 allows nFET programming; decreases the number of poles/parasitic capacitances for faster operational speeds; decreases resistance; decreases minimum supply headroom; reduces transistor count (e.g., real estate on the chip); and permits run-time programming and calibration.

Figure 12A:
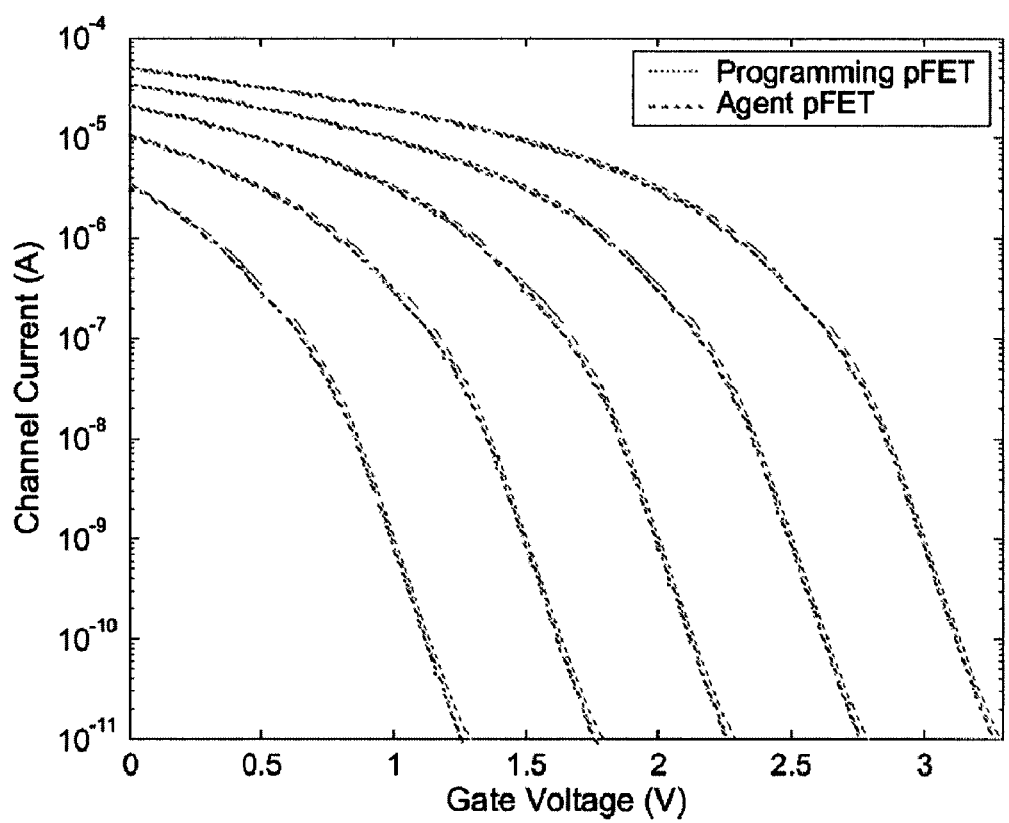
FIGS. 12A-12C, collectively known as FIG. 12, are charts illustrating various measurements of current for an indirectly programmed pFET in accordance with an exemplary embodiment of the present invention.

The most basic method of indirect programming uses hot-electron injection in the programmer pFET ($M_p$) to set the current in the agent pFET ($M_a$) and tunneling for erasing the current. The programmer pFET may be placed in a large floating-gate array 100, similar to that shown in FIG. 10B, where it may be selected and programmed. Assuming that the drain 109 and source 106 potentials of the programmer pFET and the agent pFET are similar, the output of the agent pFET may be a scaled version of the programmer pFET. Generally, scaling is caused by $$\frac{W}{L}$$

ratios and any mismatch between the two devices. FIG. 12A shows the I-V characteristics for a gate sweep of both the programmer pFET and the agent pFET, which are identically sized devices $$\left(\frac{W}{L} = 2\right).$$

Typically, the agent current is unobservable, but by utilizing an isolated pFET-pFET pair that shares the same floating-gate 112, certain characteristics may be observed.

Figure 12B:
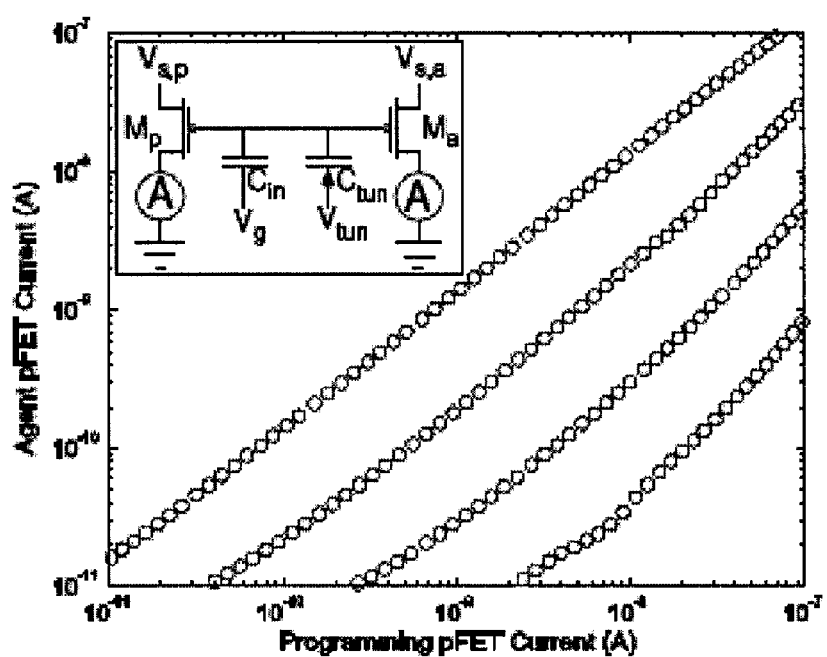

Unfortunately, assuming that the sources 106 and drains 109 of the two transistors 103 are at similar potentials is not always valid. Varying the source 106 potential of the agent pFET may generate different results, as shown in FIG. 12B. With both transistors 103 in the subthreshold regime, varying the programmer pFET current yields approximately a 1:1 change in the agent pFET current. The exact relationship is a ratio of the subthreshold slope, $$\frac{\kappa}{U_T},$$

of the two transistors 103, which should be very closely matched due to their same orientation and close proximity in layout.

Figure 12C:
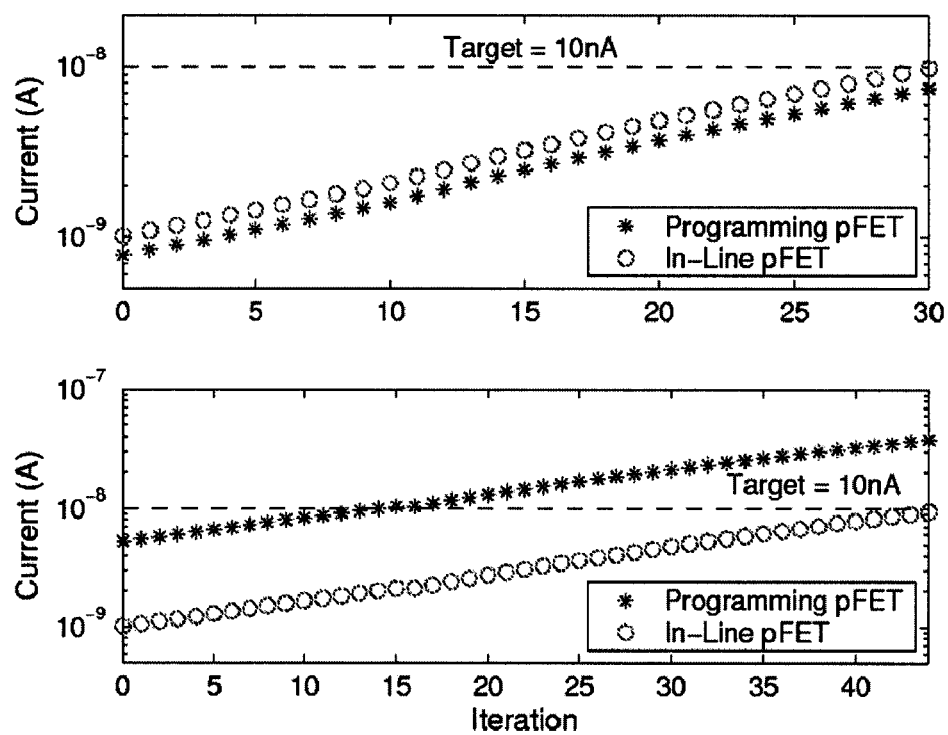

In order to provide characteristics of indirect programming, the charts of FIGS. 12A-12C illustrate various measurements of current for an indirectly programmed pFET. One skilled in the art will recognize that the data provided is for understanding the invention, but not for limiting the scope of the invention.

Typically, only the programmer current is observable when programming the agent current to a desired value. Measurement of the programmer current, therefore, may be used to predict the current flowing through the agent. Using characterization curves, such as the ones shown in FIG. 12B (which account for the subthreshold slopes and the differences in current due to differing source 106 potentials), the agent current may be accurately programmed. Accordingly, the characterization curves may be used to set the programmer current that will yield the desired agent current.

As illustrated in FIG. 12C, this technique may be used to accurately set the agent current within tolerance for two different values of the agent's source 106 potential. While achieving high precision on the actual programmed current in the agent is important, the ultimate goal of accurate programming is to achieve precise control over the operation of the overall circuit.

As described above, an important advantage of indirect programming is that it provides a simple mechanism for programming an nFET, whereas low injection efficiency makes direct nFET programming difficult. In this embodiment, a pFET and an nFET share a common floating gate 112, as illustrated in FIG. 9B.

In order to appreciate the advantages of programming an nFET, FIGS. 13A-13F provide schematic diagrams and charts that illustrate circuitry used for indirectly programming an nFET using a programmer pFET, and various measurements of characteristics and accuracy. The I-V characteristics of both the nFET and the pFET can be viewed in FIG. 13B. The current level at which both transistors 103 have equal currents is generally very high when the transistors 103 are not properly sized (see FIG. 13C).

Unlike the pFET-pFET embodiment, a direct relationship between the two transistors 103 is not easily obtained. A current-to-current relationship as provided in curve 1 of FIG. 13B results when the two transistor currents are not in subthreshold simultaneously. More specifically, small changes in the pFET current result in large changes in the nFET current. Accordingly, restricting the operation to strictly subthreshold is desirable, because it linearizes the current-to-current ratio.

Figure 13A:
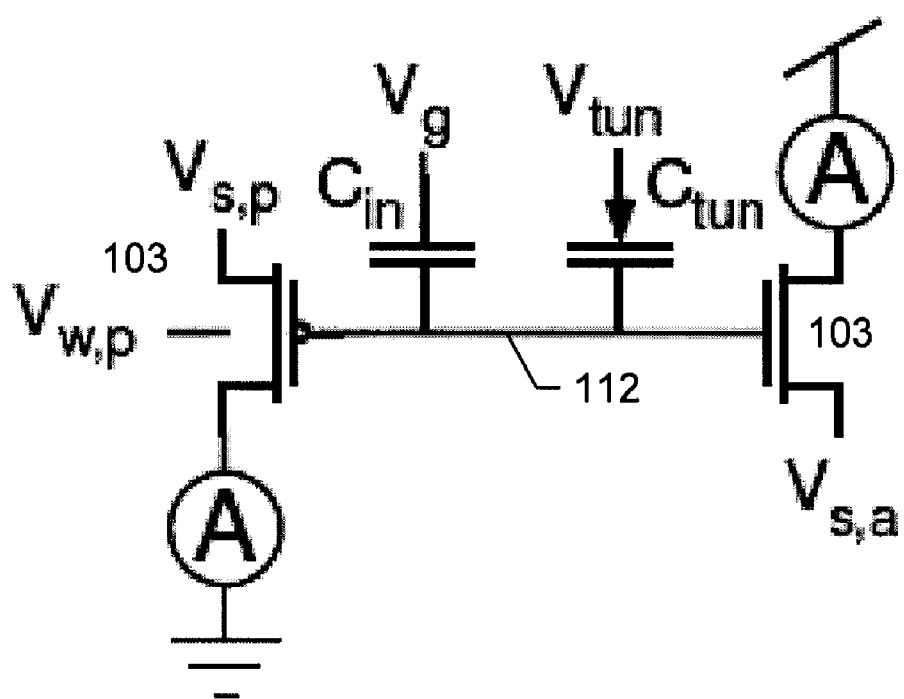
FIGS. 13A-13F, collectively known as FIG. 13, are schematic diagrams and charts illustrating circuitry used for indirectly programming an nFET using a programmer pFET, including various measurements of characteristics and accuracy, in accordance with an exemplary embodiment of the present invention.
Figure 13B:
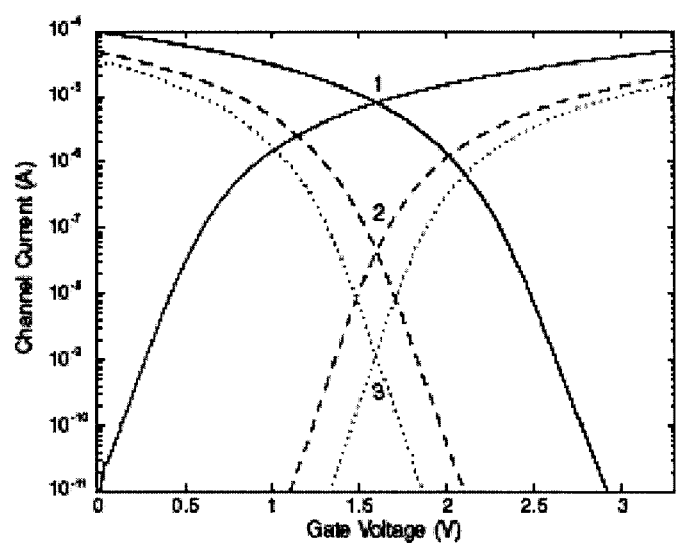

In accordance with the present invention, two methods may be used to ensure that both transistors 103 are simultaneously in the subthreshold regime. A first method requires moving the sources 106 of both transistors 103. Decreasing the pFET source 106 (referenced to well voltage $V_{well}$) and increasing the nFET source 106 (referenced to bulk voltage $V_{bulk}$) reduces the current in each transistor 103. Consequently, threshold voltages are moved towards a point in which it is possible to operate both transistors 103 in subthreshold at the same time. FIG. 13B illustrates the pFET-to-nFET current relationship for each set of curves provided in FIG. 13A. Lowering the crossover point increases the linear range of the current-to-current ratio. A linear current-to-current relationship makes predicting the agent current trivial. Any reasonable current-to-current relationship (like curve 2 in FIG. 13B) allows accurate programming of the nFET.

Figure 13C:
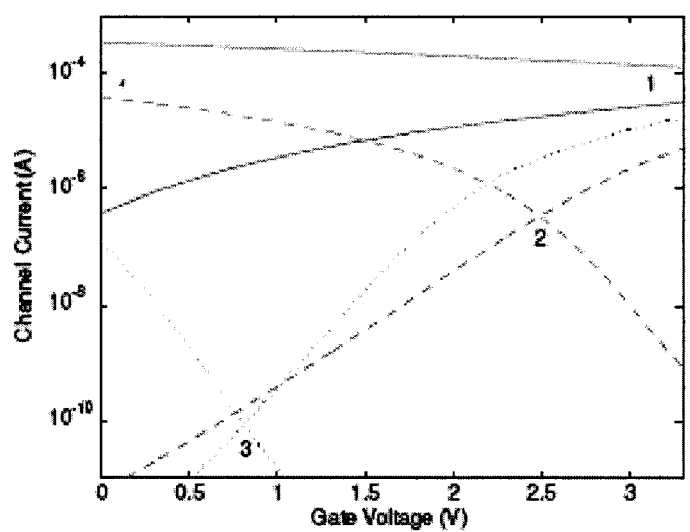

The first method, described above, is not always possible, because the source 106 of the agent may not always be accessible or may be set to a given potential due to placement within the circuit. Accordingly, a second method of the present invention ensures that both transistors 103 are in subthreshold by requiring that the programming pFET is in an accessible well isolated from the operational circuit. By raising the potential of the programmer's well and also lowering its source potential, the current flowing through the pFET is reduced. Using this procedure, the currents flowing through the nFET and pFET can be made to cross each other in the subthreshold regime. FIG. 13C shows the operation of this method for the worst case scenario in which the pFET is much larger than the nFET $$\left(\frac{W_p}{L_p} = 10\frac{W_n}{L_n}\right).$$

Since the pFET is so much larger than the nFET, larger voltage differences from $V_{dd}$ should be used in this example to bring the currents to be simultaneously in subthreshold operation. Typically, a nearly minimum-sized programmer pFET would be used, and the voltage differences would not be as large, but, for illustrative purposes, this operation is still possible under the worst-case scenario.

Described more fully below, the movement of the nFET's current is due to capacitive coupling onto the floating gate 112. In this example, the movement is maximized due to the large size of the pFET. Additionally, the change in the subthreshold slope, as seen in FIG. 13, is another result of the pFET's large size and would be minimized for smaller transistor sizes.

Figure 13D:
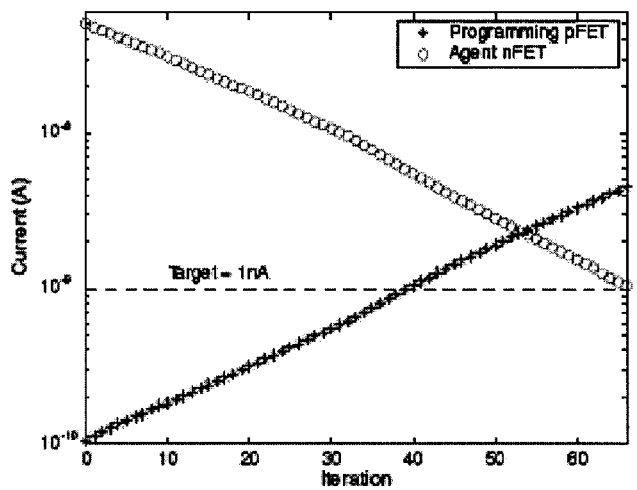

Either of the presented methods may be used to accurately program a current in the nFET. By keeping both transistors 103 in subthreshold and measuring the pFET's current, the linear relationship of either FIG. 13E or FIG. 13F may be used to predict the nFET's current. Further, FIG. 13D illustrates an example of accurately programming a current in the nFET where only the pFET's current is observable during the programming routine.

The difference between source potentials of the programming pFET and the agent transistor need to be taken into account when programming, so that the correct current flows through the agent. The drain potentials of the two transistors 103 are also of concern, especially the drain 109 of the agent, because the operation of its connected circuit can affect the potential at the drain 109. All transient coupling effects may be eliminated by holding constant the terminals of the programmer pFET when not programming.

Figure 14A:
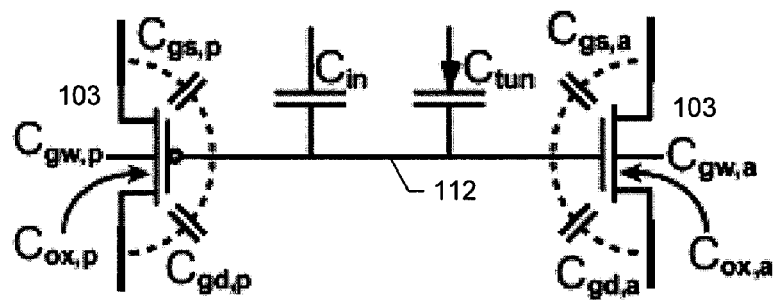
FIGS. 14A-14B, collectively known as FIG. 14, are a schematic diagram and chart illustrating a pair of transistors sharing the same floating-gate and measurement of transistor drain sweeps in accordance with an exemplary embodiment of the present invention.
Figure 14B:
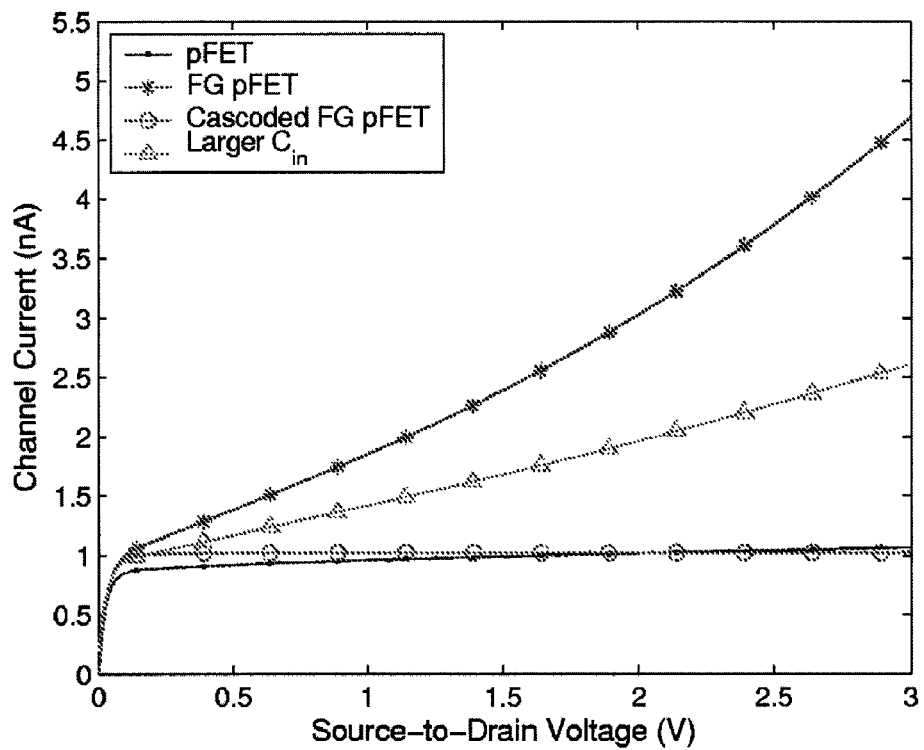

In order to introduce capacitive coupling with indirect programming, FIG. 14A provides a schematic of a pair of transistors 103 sharing the same floating gate and the parasitic capacitances that allow coupling of voltages onto the floating node. FIG. 14B provides a chart illustrating transistor drain sweeps with regard to subthreshold current flowing through a pFET, a floating-gate pFET, a cascoded floating-gate pFET, and a larger input capacitance. Typically, the voltage on any floating-gate node may be set by a combination of the floating-gate charge and a sum of the inputs to the gate through capacitive dividers. The extension of the floating-gate voltage for indirect programming is depicted in FIG. 14A and described by $$V_{FG} = \frac{Q_{FG}}{C_T} + \frac{C_{in}}{C_T}V_g + \frac{C_{tun}}{C_T}V_{tun} + \frac{C_{gd,p}}{C_T}V_{d,p} + \frac{C_{gs,p}}{C_T}V_{s,p} + \frac{C_{gw,p}}{C_T}V_{w,p} + \frac{C_{ox,p}}{C_T}\psi_p + \frac{C_{gd,a}}{C_T}V_{d,a} + \frac{C_{gs,a}}{C_T}V_{s,a} + \frac{C_{gb,a}}{C_T}V_{b,a} + \frac{C_{ox,a}}{C_T}\psi_a \quad (5)$$

where $C_T$ is the total capacitance connected to the floating-gate node, the p and a subscripts indicate the programmer and the agent, and $\psi$ represents the surface potential of each transistor 103 (constant $\psi$ in subthreshold). The drain 109 of the transistor 103 acts as an input to the gate, because $C_{gd,a}$ is a small parasitic capacitance. As illustrated in FIG. 14B, the subthreshold current flowing through the device changes exponentially as the drain voltage of the agent is swept. This is a significant alteration from the small slope due to the Early voltage of an identically sized transistor 103.

In essence, this drain coupling of the agent can be viewed as reducing the effective Early voltage, which is undesirable if using the transistor 103 as a current source. By rewriting equation (5) as $$V_{FG} = \frac{C_{in}}{C_T}V_g + \frac{C_{gd,a}}{C_T}V_{d,a} + V_{offset} \quad (6)$$

where $V_{offset}$ represents all the other terms in equation (5), replacing the gate term in the subthreshold equation (3) with equation (6), and dropping the a subscript for the agent, the saturation current becomes $$I = I_0 e^{\kappa\left(\frac{C_{in}}{C_T}V_g + \frac{C_{gd}}{C_T}V_d + V_{offset}\right)/U_T} e^{-V_s/U_T} e^{V_d/V_A}. \quad (7)$$

Rearranging, this expression takes the form $$I = I_0 e^{\kappa V_{offset}/U_T} e^{\kappa \frac{C_{in}}{C_T}V_g/U_T} e^{-V_s/U_T} e^{V_d\left(\frac{1}{V_A} + \frac{\kappa C_{gd}}{C_T U_T}\right)} \quad (8)$$
$$= I_0 e^{\kappa V_{offset}/U_T} e^{\kappa \frac{C_{in}}{C_T}V_g/U_T} e^{-V_s/U_T} e^{V_d\left(V_A \| \frac{C_T U_T}{\kappa C_{gd}}\right)}.$$

The effective Early voltage is thus $$V_{A,eff} = V_A \left\| \frac{C_T U_T}{\kappa C_{gd}} \right. . \quad (9)$$

With typical capacitance values, the effective Early voltages for floating-gate transistors 103 may easily fall into the range of 1V, much like the floating-gate transistors 103 shown in FIG. 14B.

If supply headroom issues are important, then the drain-coupling effect may be minimized by increasing the input gate capacitance. Increasing $C_{in}$ increases $C_T$, thereby reducing the effects of coupling through the parasitic capacitances, such as $C_{gd,a}$. While the saturation current still has an exponential increase with drain potential, the effective Early voltage is increased, as is shown in FIG. 14B. Alternatively, if supply headroom issues are not a concern, then the drain-coupling effect may be completely removed by adding a cascode transistor 1112 at the drain 109 of the agent. The saturation current received by the circuit is flatter than even a standard transistor 103, as is shown in FIG. 14B.

Coupling through the gate-to-drain capacitances is not the only source of coupling into the floating node. In fact, all the terminals affect the drain currents of the two transistors 103 to varying degrees by coupling into the floating node, as was shown in equation (5). These varying degrees depend on both the total capacitance, $C_T$, connected to the floating-gate 112 and also the size of the capacitor 127 through which the voltage couples, which is typically a small parasitic capacitance. Increasing $C_T$ decreases the capacitive coupling affects, as does decreasing the parasitic capacitances through which the coupling takes place. For example, simply increasing the drawn $C_{in}$ and using a minimum-sized transistor 103 will reduce the effect of the overlap capacitance, $C_{gd}$, coupling into the floating gate 112. For this reason, when programming an nFET-pFET pair and altering the pFET's source and well potentials, these voltages alter the charge on the floating node. This is the reason that the nFET's curve shifts, as shown in FIG. 13C, because the pFET is a large device, and the parasitic capacitances between the gate and source 106 and the gate and well are comparable to $C_T$. Consequently, nearly minimum-sized programmer pFETs should be used when using an nFET-pFET pair to reduce the parasitic capacitances.

The change in the subthreshold slope when modifying the pFET's source 106 and well potentials provides another reason for making the programmer pFET small in an nFET-pFET pair. The parasitic capacitances of a transistor 103 are different depending on which mode of operation the transistor 103 is in (subthreshold or above threshold). To minimize the changes in the coupling affects between modes of operation, the transistors 103 should be made small so that the input capacitance, $C_{in}$, dominates the total capacitance, $C_T$.

An indirectly programmed transistor 103 may accurately bias a current although the direct current operating point of the agent transistor 103 is not known and the drain current has an exponential dependence upon all of its terminals. This is true even if no cascode is used to protect the drain terminal 109. The overall operation of the circuit may be tuned so precisely using indirect programming that the effects of device mismatches may be negated, even though the current through the agent transistor 103 is unobservable.

Figure 15A:
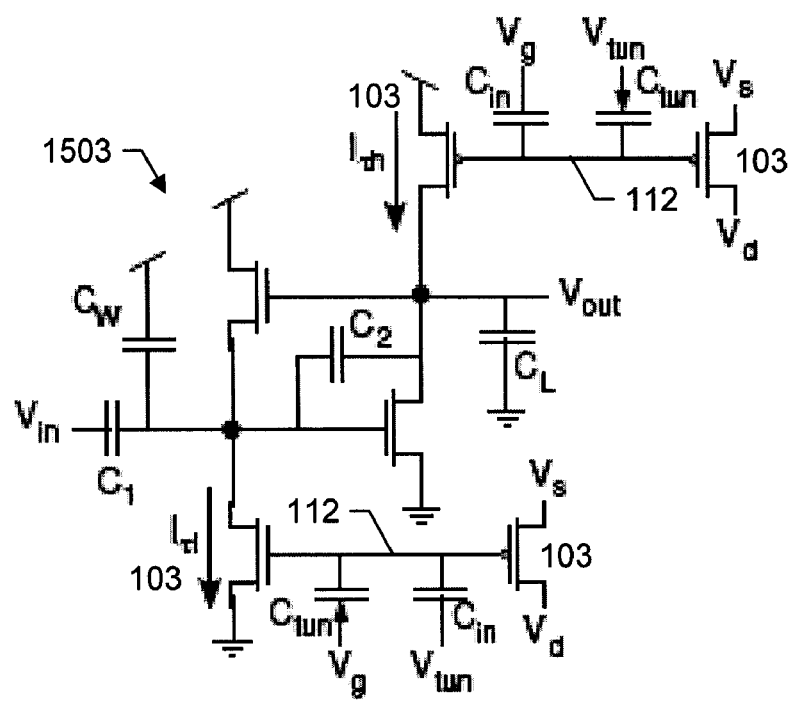
FIGS. 15A-15C, collectively known as FIG. 15, are a schematic diagram and charts illustrating circuitry and various measurements for an indirectly programmed version of a capacitively coupled current conveyer in accordance with an exemplary embodiment of the present invention.
Figure 15B:
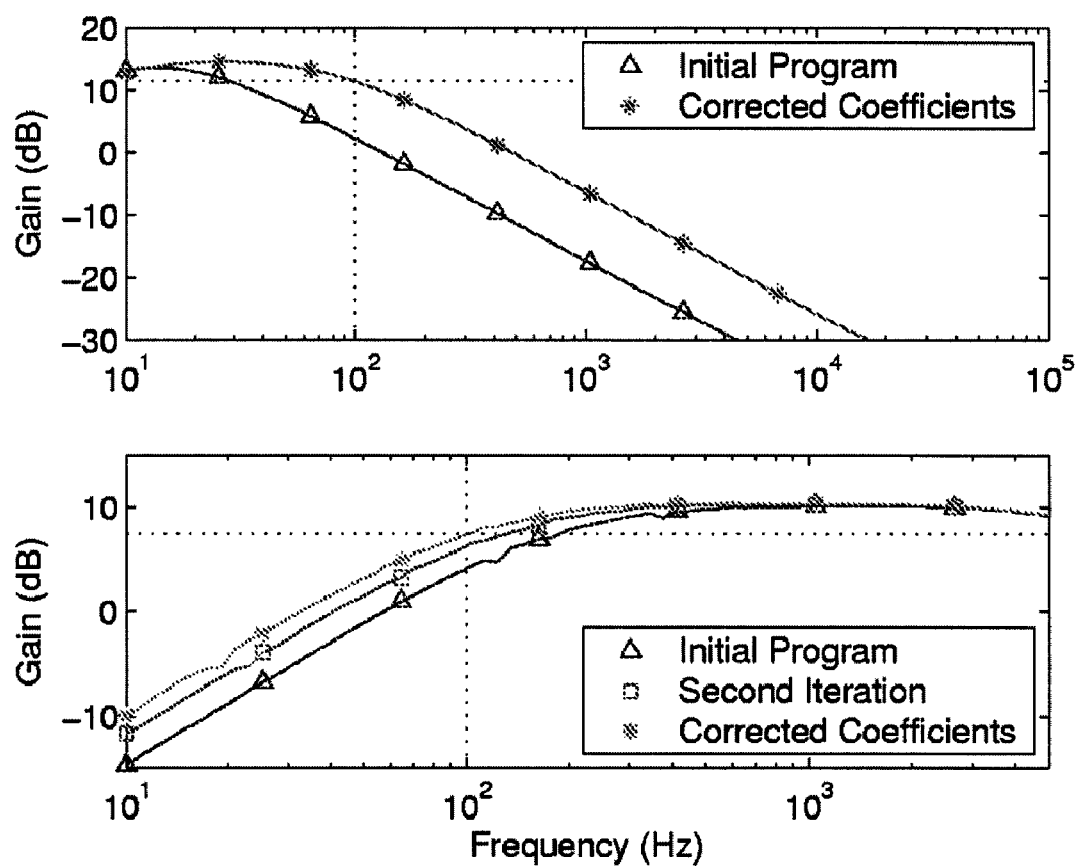
Figure 15C:
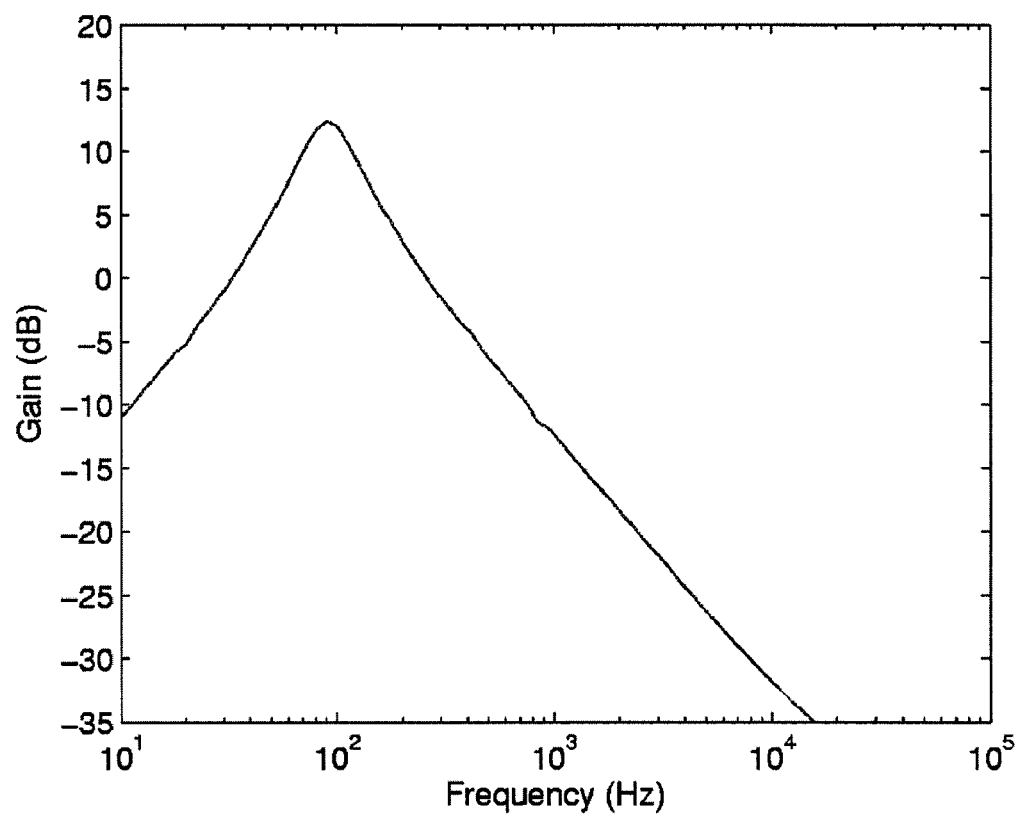

To show the versatility of indirect programming, FIGS. 15A-15C provide a schematic diagram and charts illustrating circuitry and various measurements for an indirectly programmed version of a capacitively coupled current conveyer ($C^4$) 1503. Using the exemplary circuit shown in FIG. 15A, the $C^4$ 1503, which is a bandpass filter typically used in audio applications, serves as a helpful example of indirect programming, because the two corner frequencies are each set solely by the current flowing through a single transistor 103, where one should be an nFET and the other a pFET.

Generally, the C⁴ 1503 is a capacitively based bandpass filter with electronically tunable corner frequencies that are independent of each other. The frequency response of the C⁴ 1503 is given by $$\frac{V_{out}}{V_{in}} = -\frac{C_1}{C_2} \frac{s\tau_l}{s^2\tau_h\tau_l + s\left(\tau_l + \frac{C_2 U_T}{\kappa I_{\tau_h}}\left(\frac{C_o}{\kappa C_2} - 1\right)\right) + 1} \quad (10)$$

where the time constants are $$\tau_l = \frac{C_2 U_T}{\kappa I_{\tau_l}}, \quad (11)$$

$$\tau_h = \frac{C_T C_O - C_2^2}{C_2} \frac{U_T}{\kappa I_{\tau_h}}$$

and a high-frequency zero, which occurs at sufficiently high-frequencies, has been neglected. The total capacitance, $C_T$, and the output capacitance, $C_O$, are defined as $C_T = C_1 + C_2 + C_W$ and $C_O = C_2 + C_L$. The currents $I_{\tau_h}$ and $I_{\tau_l}$ are the bias currents through the pFET and nFET agents, respectively, as shown in FIG. 15A. In consequence, the current flowing through a pFET alone controls the high corner frequency, and the current flowing through an nFET alone controls the low corner frequency. As a result, the C⁴ 1503 is a good circuit example for showing the proper programming procedure, because the filter's operation is directly affected by both a pFET and an nFET. Programming a C⁴ 1503 to have precisely tuned time constants requires finding an estimate of the effective mismatch of the devices involved in each time constant.

Programming an agent pFET to yield a desired circuit performance is a straightforward procedure. The method involves two steps in which a current is programmed into the pFET, and the effects of mismatch are then calibrated out.

First, the programmer pFET is initially programmed to the current that should yield correct circuit performance of all devices. An initial current is programmed into the programmer pFET using the designed values and a rubric for the correct circuit operation. Unfortunately, the actual performance of the circuit will not equal the idealized performance, because the direct current operating point of the agent will likely differ from the programmer. Nevertheless, once the programmed current and the resulting circuit performance are known, the function relating the two may be calculated. This function incorporates both the deviations from the ideal device parameters and also the difference in direct current operating points of the programmer and agent. Accordingly, the circuit may be reprogrammed to any desired performance.

Using the example of the C⁴ 1503, the pFET agent exclusively controls the high corner frequency. The rubric for knowing correct circuit operation is thus the placement of the high corner frequency, which is given by $$f_h = \frac{1}{2\pi} \frac{C_2}{C_T C_O - C_2^2} \frac{\kappa_{p,eff} I_{\tau_h}}{U_T}. \quad (12)$$

where $\kappa_{p,eff}$ is the effective coupling onto the surface potential including the input capacitor, $C_{in}$. Assuming ideal values for the capacitors 127 and $\kappa_{p,eff}$, an initial current may be programmed into the programmer pFET, such that the resulting corner frequency should be the target value. The actual programmed corner frequency does not fall within tolerance of the target value, because the idealized values are not the actual values and the drain 109 of the agent is not the same as that of the programmer. The function relating the corner frequency and the current, however, only involves a single coefficient, because the currents are remaining in subthreshold and equation (12) applies.

By equating all the coefficients of the programmed current into a single coefficient, equation (12) becomes $$f_h = K_{high} I_{\tau_h}. \quad (13)$$

As the programmed current and the circuit output (e.g., the corner frequency) are known, the true value for $K_{high}$ may be calculated. Now, $$K_{high} = \frac{1}{2\pi} \frac{C_2}{C_T C_O - C_2^2} \frac{\kappa_{p,eff}}{U_T} k_{DC}, \quad (14)$$

where all the device parameters represent their actual values, and $k_{DC}$ represents the shift in the bias current between the agent and the programmer due to differences in the direct current operating point. By using equation (13) with the measured value of $K_{high}$, a second programming step may be used to produce the desired corner frequency.

As illustrated in FIG. 15B, the high-degree of accuracy of the indirect programming method is clear for the exemplary programming of the C⁴'s 1503 high corner frequency. The crosshairs indicate the location of the ideal −3 dB frequency. Further improvements in accuracy may be achieved by improving the accuracy of the floating-gate programming algorithm.

Programming an nFET agent (instead of a pFET agent) generally requires a slightly different methodology. The current through an nFET agent follows an inverse relationship to the current through its programmer pFET and, therefore, programming a precise current in a pFET-nFET case is more complicated than the pFET-pFET case. A high degree of characterization of the nFET-pFET combination will ease the programming procedure. This characterization, however, is not required and, through the following example, accuracy may be achieved even when an exact relationship between the nFET and pFET is not initially known.

The method begins by programming an initial current into the programmer pFET that will translate as closely as possible to an nFET agent current that will yield the desired circuit operation. The translation from programmer current to agent current may be estimated by a characterization nFET-pFET pair on the periphery of the die area or even by simulation. A circuit measurement may be taken to determine the deviation from the ideal performance. Such a deviation is generally due to deviations in parameter sizes and values, as well as differences in the agent current from the expected value.

Figure 13E:
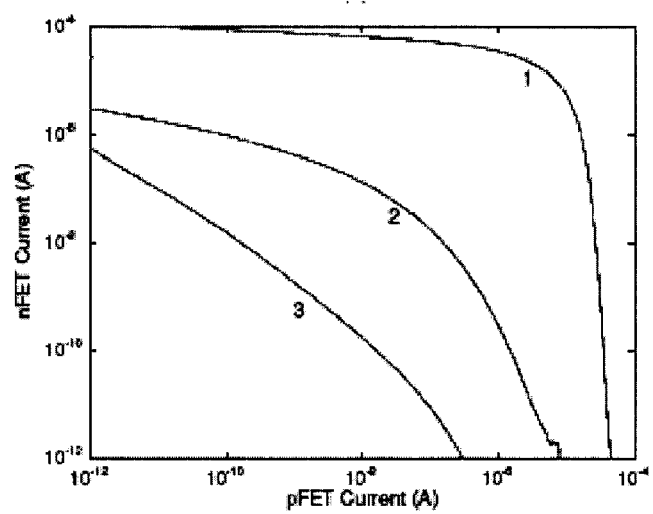
Figure 13F:
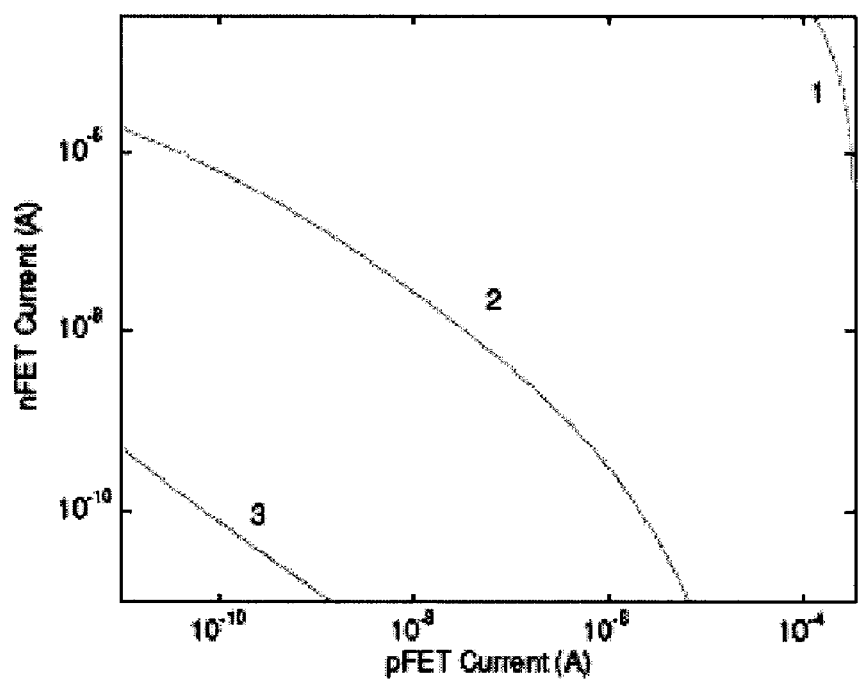

Whereas simply finding the estimate of the device and current mismatch for a given parameter was sufficient for the pFET-pFET case, this method is no longer sufficient for the nFET-pFET case. Placing both the programmer and agent transistors 103 into subthreshold simultaneously greatly eases the programming procedure, because the relationship is linearized (on a logarithmic scale), as is shown in FIG. 13E-13F. Generally, two calibration steps are required to accurately program an nFET. The first calibration step allows the effective mismatch to be found, and the second step allows the slope of the relationship between the programmer and the agent to be determined. After performing the two calibration steps, the current may be programmed so that the circuit accurately performs the desired action.

Again, using the $C^4$ 1503 as a circuit example, the low corner frequency is of interest, because the low corner frequency of the $C^4$ 1503 requires only the current through the nFET agent to be modified. The low corner frequency is given by $$f_l = \frac{1}{2\pi} \frac{\kappa_{n,\text{eff}} I_{\tau_l}}{C_2 U_T}. \tag{15}$$

Using an estimate for the nFET agent's current and the ideal values for the device parameters, a current may be programmed such that the low corner frequency should hit its target. The actual corner frequency, however, will likely deviate from the desired value due to both device mismatch and the difference from the desired nFET current. The actual corner frequency will have a value of $$f_1 = \frac{1}{2\pi} \frac{\kappa_{n,\text{eff}} I_{n1}}{C_2 U_T} = K_{low} I_{n1} \tag{16}$$

where $f_1$ is the initial measured corner frequency, $K_{low}$ is the estimated multiplicative coefficient, and $I_{n1}$ is the unknown and unobservable agent current.

In addition to the unknown agent current, the relationship between the programmer and agent currents is also not yet known. An alternative way of viewing this problem is that the slope of the curve in FIG. 13F is not known, even when assuming subthreshold operation. A second current should be programmed into the programmer using equation (16), such that $$f_2 = K_{low} I_{n2} \tag{17}$$

where $I_{n2}$ is the agent current and $f_2$ is the resulting corner frequency. This new corner frequency, however, will likely not fall within tolerance because the exact value of $I_{n2}$ is not observable.

Nevertheless, there is now enough information to program the circuit accurately on a third iteration, and this is done by finding the slope of FIG. 13F, assuming subthreshold operation. To find this slope, equation (16) is divided through by equation (17), resulting in $$\frac{f_1}{f_2} = \frac{K_{low} I_{n1}}{K_{low} I_{n2}} = \frac{I_{n1}}{I_{n2}}. \tag{18}$$

Then, letting m represent the slope of FIG. 13F and using the ratios of equation (18), the slope is given by $$m = \frac{\ln(I_{n2}) - \ln(I_{n1})}{\ln(I_{p2}) - \ln(I_{p1})} = \frac{\ln\left(\frac{I_{n2}}{I_{n1}}\right)}{\ln\left(\frac{I_{p2}}{I_{p1}}\right)} = \frac{\ln\left(\frac{f_2}{f_1}\right)}{\ln\left(\frac{I_{p2}}{I_{p1}}\right)}. \tag{19}$$

Now, letting k represent the programming iteration number, the slope may be written as $$m = \frac{\ln\left(\frac{f_{k+1}}{f_k}\right)}{\ln\left(\frac{I_{p,k+1}}{I_{p,k}}\right)} \tag{20}$$

where knowledge of only the programmer currents and resulting corner frequencies are required. By rewriting equation (20) and letting $f_{k+1}$ represent the desired corner frequency, the exact current that should be programmed into the programmer is given by $$I_{p,k+1} = I_{p,k}\left(\frac{f_{k+1}}{f_k}\right)^{1/m}. \tag{21}$$

Thus, in three steps, the relationship between the nFET and pFET has been determined, the effects of mismatch have been calibrated out, and the circuit has been programmed to the desired corner frequency.

The results from using this programming procedure to program $C^4$'s 1503 low corner frequency are illustrated in FIG. 15B. On the third iteration, the corner frequency fell well within the tolerance of the programming algorithm, as is indicated with the ideal −3 dB point depicted with the crosshairs. Again, this percentage error may be improved even further by increasing the accuracy of the programming algorithm.

While the $C^4$ 1503 served as a good example of indirectly programming a circuit for precise operation criteria, the $C^4$ 1503 is by no means an exclusive case. In fact, this indirect programming method may be applied to a wide variety of circuits, and it may be viewed in its generalized form to be as that described in the flow diagram of FIG. 16.

Figure 16:
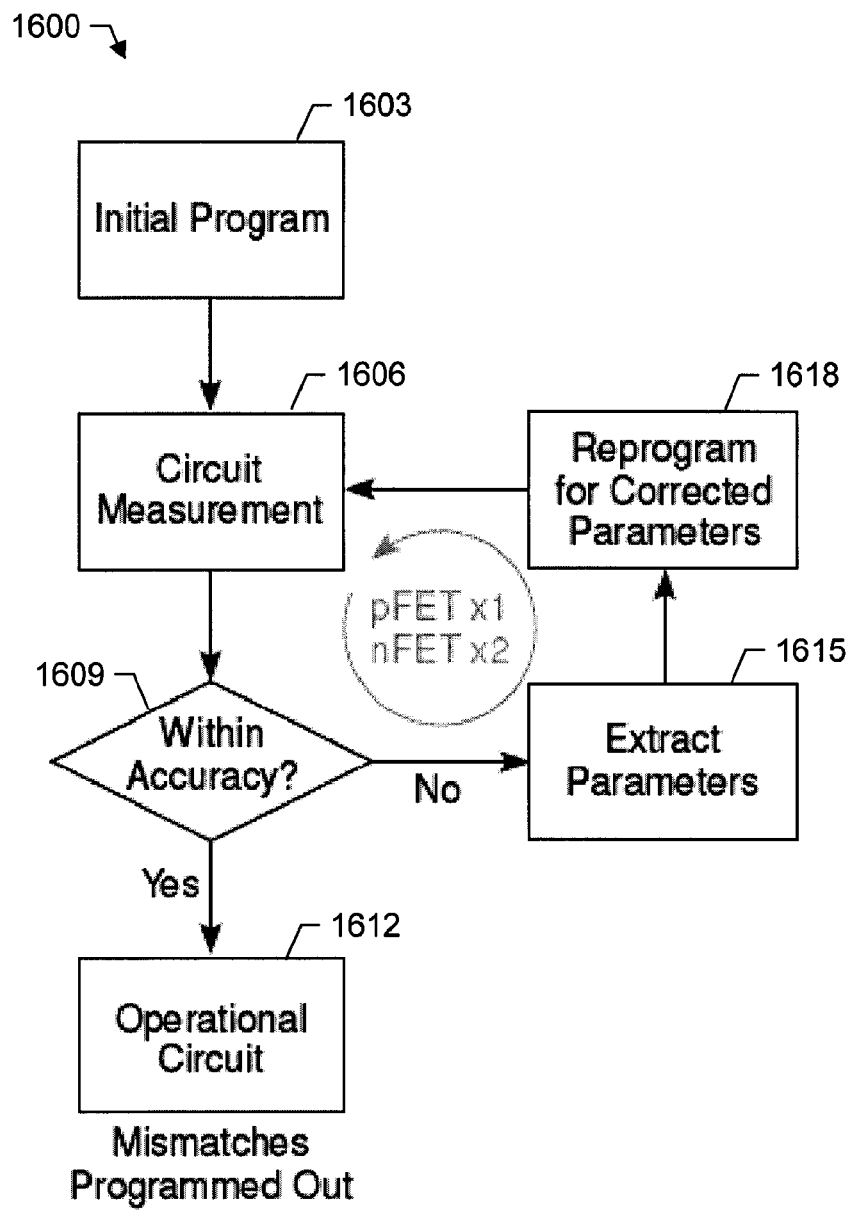
FIG. 16 is a flow-chart diagram illustrating an indirect programming method used in tuning a circuit to a desired performance in accordance with an exemplary embodiment of the present invention.

FIG. 16 is a flow-chart diagram illustrating an indirect programming method 1600 used in tuning a circuit to a desired performance. In all cases, the circuit should be initially programmed 1603 so that it would perform perfectly, if all device parameters were ideal. Some circuit measurement 1606 should then be taken, be it a frequency response, a step response, etc., to determine how far the circuit's performance was from ideal. If at any time, this circuit operates within system tolerance 1609, then no more steps are needed 1612. The initial program, however, will not likely produce the desired results, but it may be used to extract certain parameters 1615 about the circuit's operation. These parameters may include a variety of contributions, including capacitor sizes and transistor currents. These extracted parameters may then be used to reprogram the circuit 1618, and the circuit is then tested 1606 again to determine whether or not it operates within the desired tolerances.

This process, as shown in FIG. 16, may be repeated as many times as necessary. Typically, only a single time through the process is required for programming a pFET, because both the programmer and the agent follow the same current trends. A second iteration through the process is likely required for indirectly programming nFETs, because not only device parameters should be determined, but also the exact relationship between the currents in the nFET agent and the pFET programmer. Keeping both the agent and the programmer in subthreshold simultaneously aids this procedure, because the relationship is linearized, as is shown in FIGS. 13E-13F.

In addition to the ability to program out mismatches in a circuit and set precise current sources, which are both advantages available with floating-gate circuits and direct programming methods, the non-invasive nature of indirect programming has several benefits over traditional floating-gate programming methods. These benefits are largely related to the removal of the transmission gates that are needed for disconnecting floating-gate transistors for a programming phase (as used with direct programming methods).

The addition of at least one T-gate 1109 for every floating-gate transistor 103, and often more T-gates 1109 for certain circuit configurations, adds both resistance and capacitance to the floating-gate circuit. The added resistance and capacitance may have several harmful effects, by introducing parasitics to the circuit. These extra parasitics slow down the operation of the circuit and, thus, limit the speed at which the circuit can operate. Also, when using large currents in the floating-gate transistors 103, the added resistance, which is approximately 10 kΩ for small devices, will cause a significant voltage drop to form across the switch. The voltage drop may cause problems with the operation of the circuit and it could be large enough to alter the required voltage headroom of the circuit. Thus, the circuit would have to run on a larger supply voltage.

By using indirect programming many of the parasitics are removed, because indirect programming of floating-gate transistors 103 does not require the disconnection via T-gate switches 1109. Indirectly programmed floating-gate circuits have the ability to operate at higher frequencies than do directly programmed floating-gate circuits. The increase in speed with indirectly programmed floating-gate transistors 103 was demonstrated with an indirectly programmed floating-gate inverter using an ad hoc programming method. Moreover, this indirectly programmed floating-gate inverter was able to operate at faster speeds than an identically sized inverter not utilizing floating-gates 112. Furthermore, the removal of the selection switches removes the added resistance. Circuit applications requiring very low supply voltages may now utilize the programmability of floating-gate transistors 103 without concerns of headroom loss due to parasitic resistances.

Figure 17A:
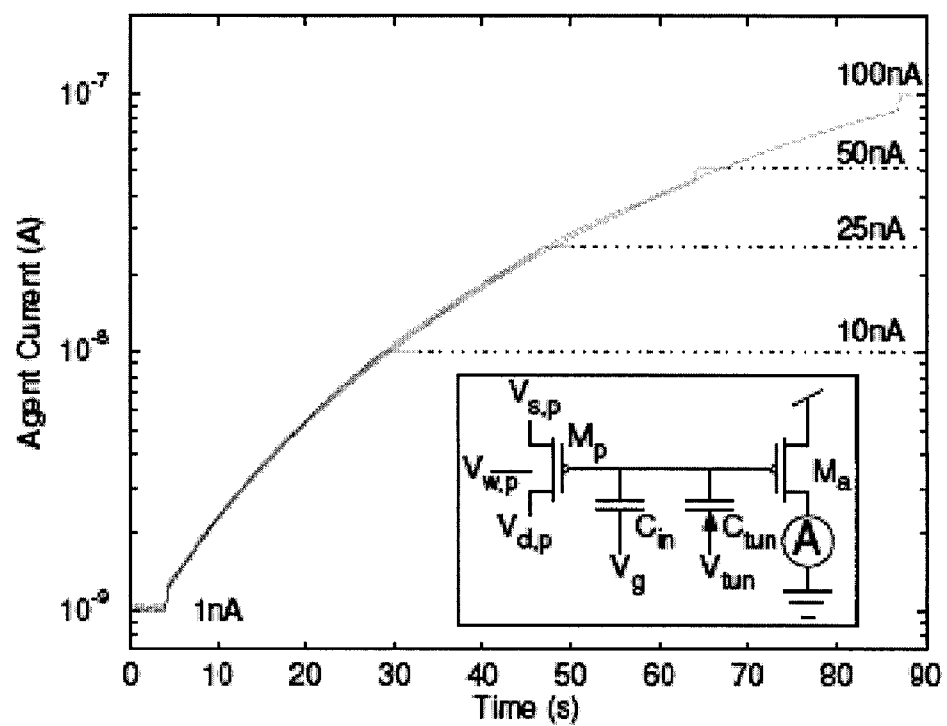
FIGS. 17A-17C, collectively known as FIG. 17, are a schematic diagram and charts illustrating circuitry and measurements of run-time programming using indirectly programmed floating-gate transistors in accordance with an exemplary embodiment of the present invention.
Figure 17B:
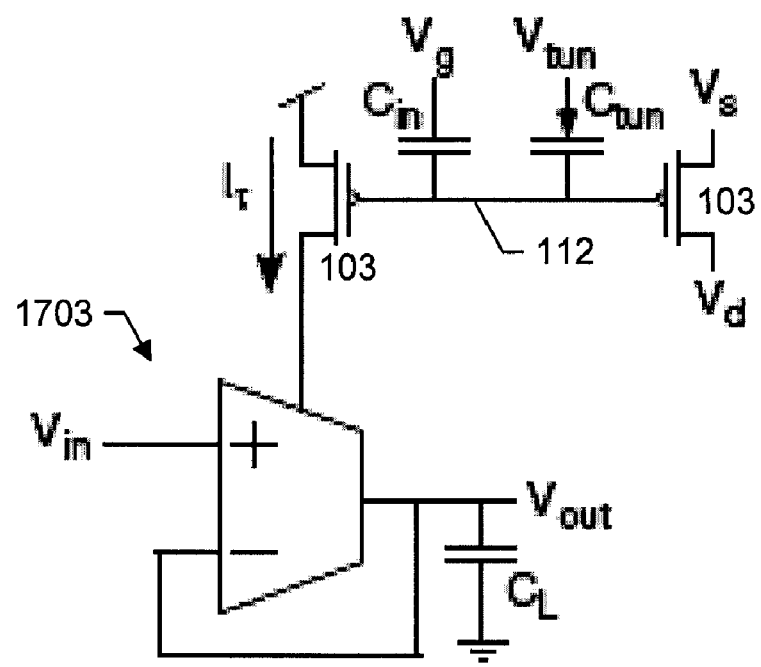
Figure 17C:
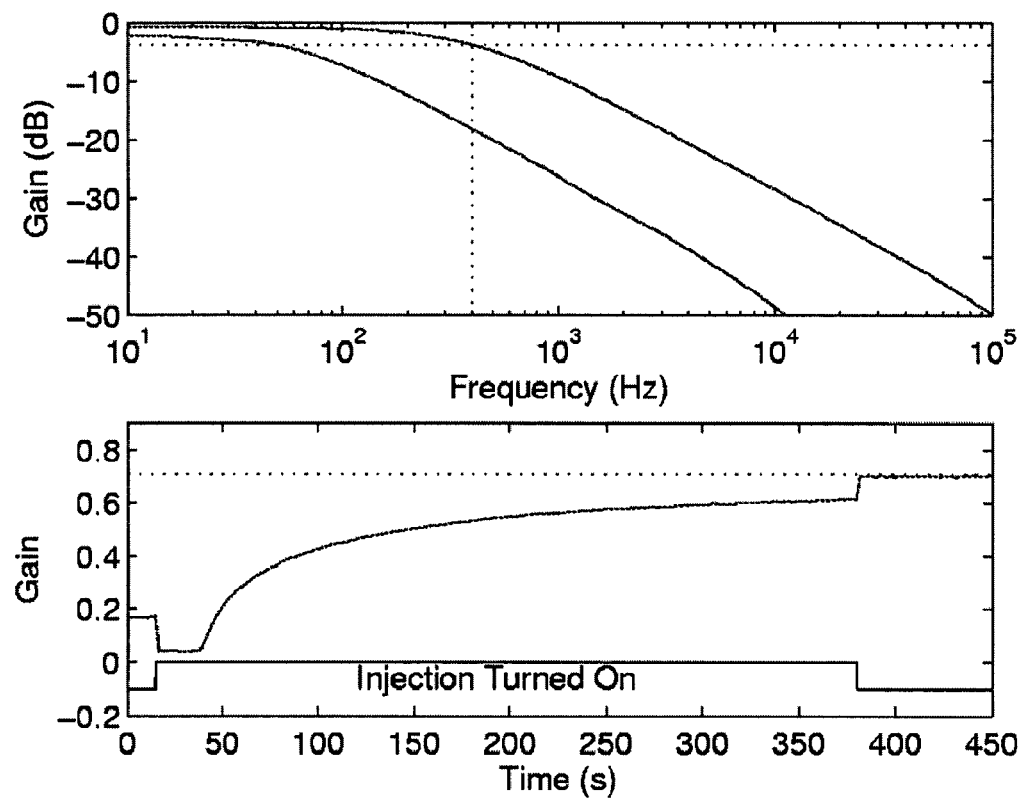

FIGS. 17A-17C provide a schematic diagram and charts illustrating circuitry and measurements of run-time programming using indirectly programmed floating-gate transistors in accordance with an exemplary embodiment of the present invention. As the use of indirect programming does not require disconnection of the agent transistor 103 from the circuit, there is now no need for a separate programming phase to set the charge on the floating-gate nodes. In fact, programming can occur during normal operation of the circuit so that data acquisition does not need to be stopped in order to reprogram the device. The ability to provide for "run-time programming," allows a circuit to be recalibrated while it is still operating, so that the circuit can respond to changes in its environment (e.g., temperature) or new desires of the circuit's user (e.g., changing the gain of a certain band of frequencies in a hearing aid). Run-time programming, unlike adaptation techniques, allows programming to be turned on temporarily whenever recalibration is desired.

While typical methods of programming floating-gate transistors 103 would work even in this run-time programming, these methods are not ideal since they involve large, instantaneous movements of the transistor's terminal voltages in order to cause injection to occur. These conventional methods of programming may cause large instantaneous changes in the agent's current that could seriously alter the operation of the circuit, because, with the indirect programming configuration, the programmer and the agent share the same floating-gate node 112 and the movements on the programmer's terminals capacitively couple onto the floating-gate node 112. Therefore, when recalibrating a circuit while it is still operating, care should be taken so that the operation of the circuit will not be temporarily rendered useless (and thus negating the benefits of using of run-time programming).

To recalibrate a floating-gate agent in run-time operation using injection, the actual charge on the floating node should remain unaltered by any process except for injection Therefore, any voltages that couple onto the floating node should always be balanced by an equal voltage coupling onto the floating node in the opposite direction. Referring back to equation (5) and FIG. 14A, if one terminal of the programmer is moved, then another terminal should also be moved in the opposite direction such that the two voltages couple identical, but opposite amounts. The current flowing through the agent will thus not be moved at all. By pulling the source 106 and drain 109 apart "symmetrically" about $V_{FG}$, the source-to-drain potential is increased until the point at which injection occurs. When injection occurs, the charge on the floating node 112 is altered, and the current flowing through the agent is modified (increased for a pFET and decreased for an nFET). When the current flowing through the agent has reached the desired value, then the injection can be turned off by returning the source and drain potentials to their normal operating values. FIG. 17A shows the operation of injecting the current to the desired value with this process.

The small discontinuities in the current levels at the onset and termination of injection are a result of parasitic-capacitance estimates not being perfectly calibrated. Additionally, the larger jump at the termination of injection is a result of the higher current levels (near or above threshold) and the resulting changes in capacitor values, because the parasitic capacitances have different values when the transistor 103 is operating in either subthreshold or above threshold. These discontinuities can be accounted for, and, thus, injection may be turned off in anticipation that the final current will be the desired value. These discontinuities may also be calibrated out and compensated.

To test the operation of run-time programming within a circuit, the exemplary circuit of FIG. 17B illustrates that by viewing the output of the circuit, the operation of the circuit may be recalibrated by using run-time programming. This circuit is simply a $G_m$-C element 1703 constructed to act as a first-order lowpass filter in which the time constant is set by an indirectly programmed transistor 103. The $G_m$ element is a five-transistor operational transconductance amplifier (OTA) in which the bias current is set with an indirectly programmed floating-gate transistor 103.

To illustrate how run-time programming may be used with the exemplary circuit, the corner frequency of the filter is programmed to below 10 Hz. Without stopping the operation of the circuit, it is desired in this example to move the corner frequency to exactly 400 Hz. Accordingly, the output of the filter is examined as injection is applied to the programmer pFET. When the circuit is observed to be operating at the desired corner frequency (e.g., 400 Hz), injection is removed. FIG. 17 shows frequency responses before and after the run-time programming as well as the observed output of the circuit while injection was occurring. The final output of the filter reflects the desired corner frequency.

The run-time method to programming floating-gate transistors 103 has promising new possibilities for circuits needing frequent updates due to environmental changes and consumer needs. Additionally, a circuit using a similar approach may be used for adaptive applications by continuously updating the stored charge on the floating gate node.

Figure 19A:
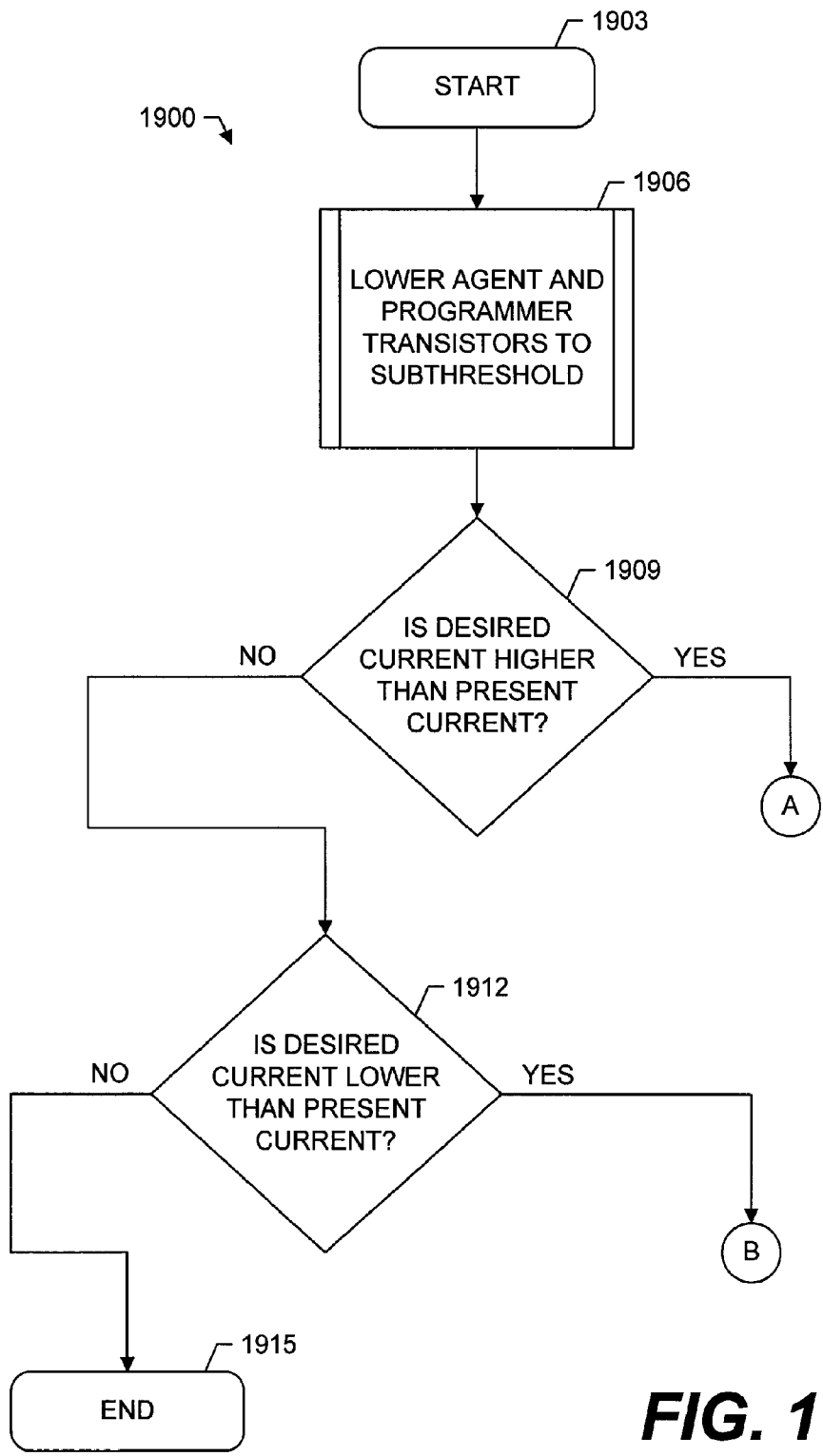
FIGS. 19A-19B, collectively known as FIG. 19, are a flow-chart diagram illustrating a method for indirectly programming an operational transistor (nFET) by programming a programmer transistor (pFET) coupled with the operational transistor via a common floating-gate in accordance with an exemplary embodiment of the present invention.
Figure 19B:
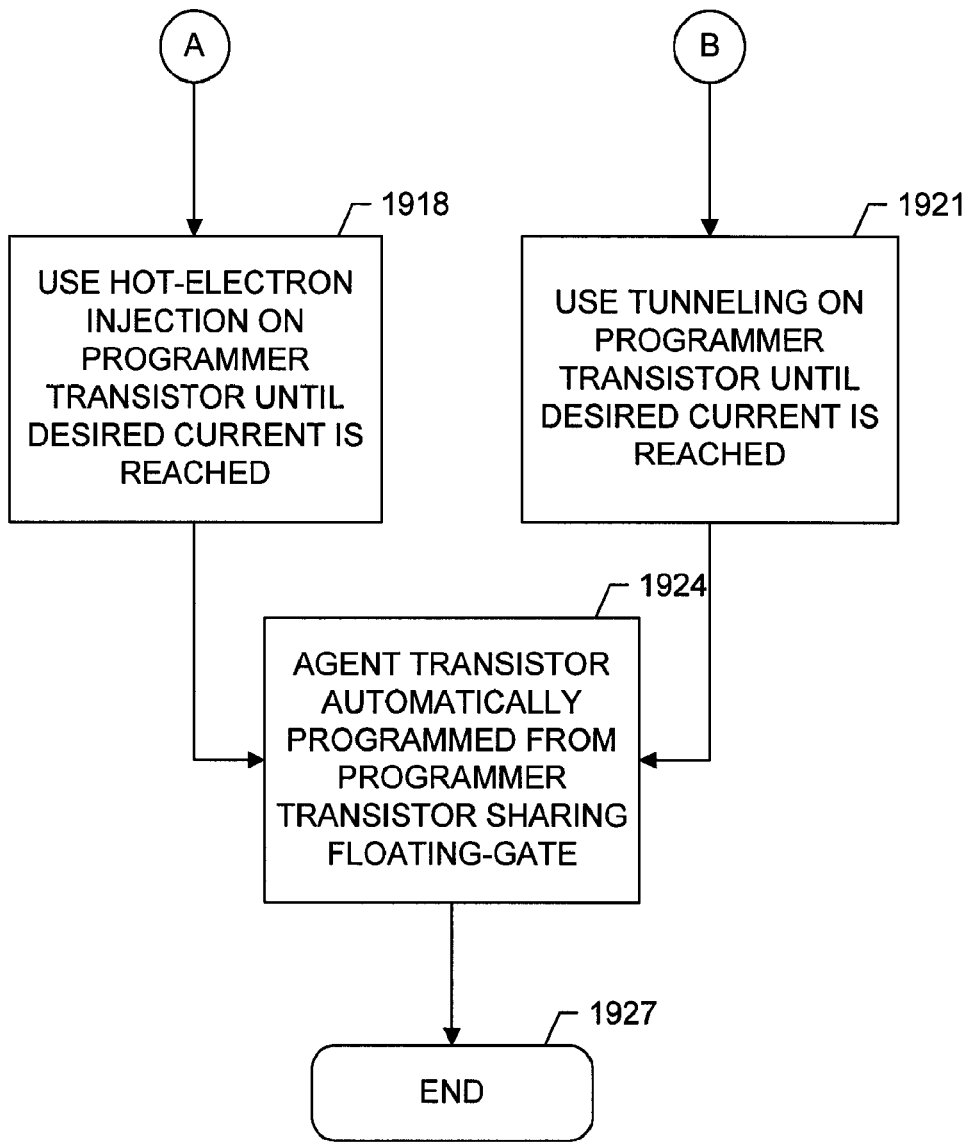

FIGS. 19A-19B provide a flow-chart diagram that summarizes the method of indirectly programming an operational transistor 103 (nFET) by using a programmer transistor 103 (pFET). In a pFET-nFET configuration the method 1900 begins at 1906 by first lowering the currents through the agent transistor 103 and programmer transistor 103 to the subthreshold regime. At 1909, a determination is made as to whether the desired current is higher than the present current of the programmer transistor 103. If at 1909 a determination is made that the desired current is higher than the present current, then the method 1900 proceeds to 1918 described below.

If, however, at 1909 a determination is made that the desired current is not higher than the present current, then at 1912 a determination is made as to whether the desire current is lower than the present current. If at 1912 a determination is made that the desired current is not lower than the present current, then the method 1900 terminates operation, because the present current is equal to the desired current.

If, however, at 1912 a determination is made that the desired current is lower than the present current, then the method 1900 proceeds to 1921 where tunneling is used on the program transistor 103 until the desired current is reached. Next, at 1924, the agent transistor 103 is automatically programmed with the desired current, as the agent transistor 103 and the programmer transistor share a common floating-gate 112. The method 1900 then terminates after successful indirect programming of the agent transistor 103.

At 1918, hot-electron injection is used on the programmer transistor until the desired current is reached. The method 1900 then proceeds to 1924 where the agent transistor 103, as described above, is automatically programmed with the desired current.

Figure 20A:
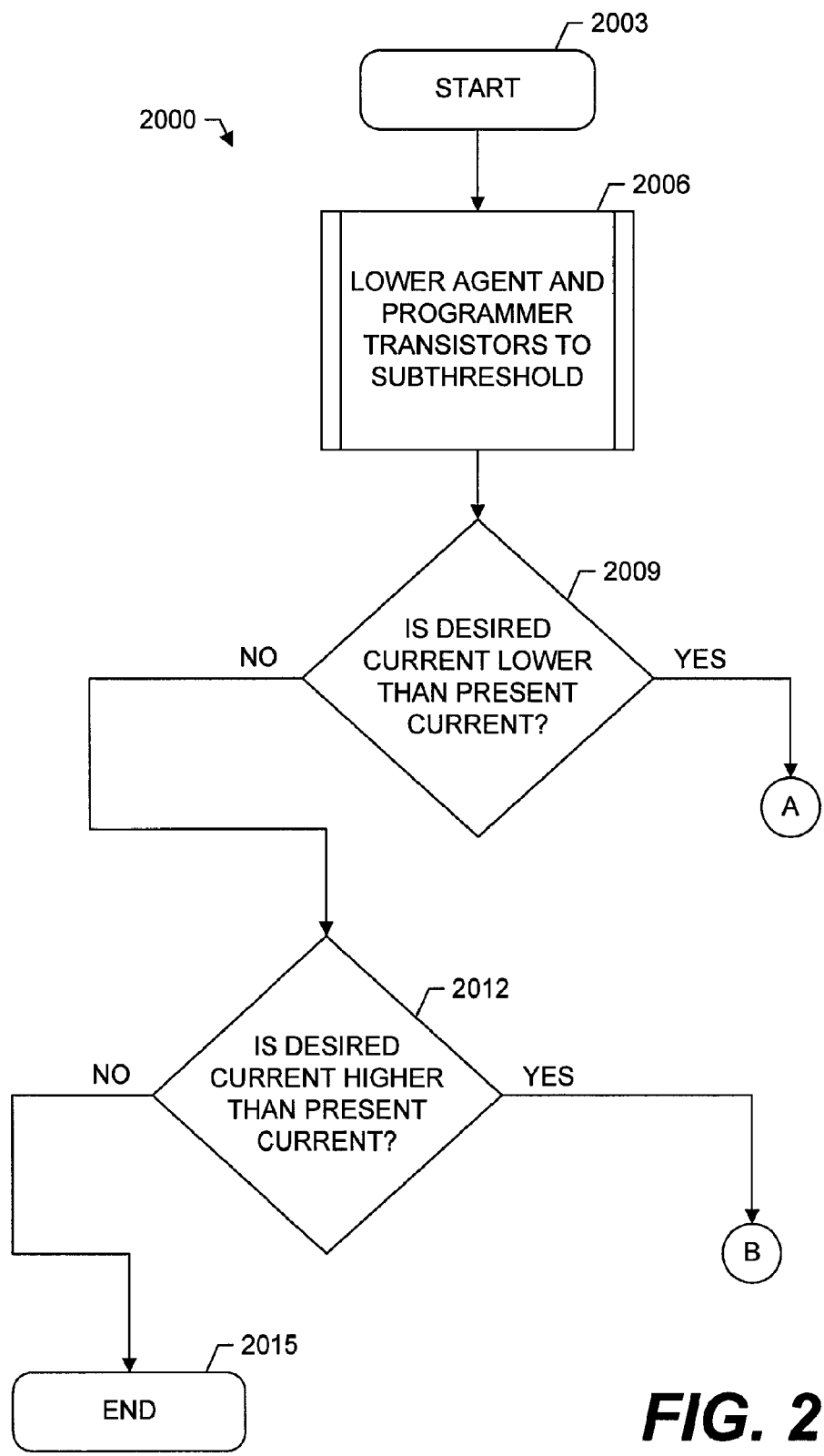
FIGS. 20A-20B, collectively known as FIG. 20, are a flow-chart diagram illustrating a method for indirectly programming an operational transistor (pFET) by programming a programmer transistor (pFET) coupled with the operational transistor via a common floating-gate in accordance with an exemplary embodiment of the present invention.
Figure 20B:
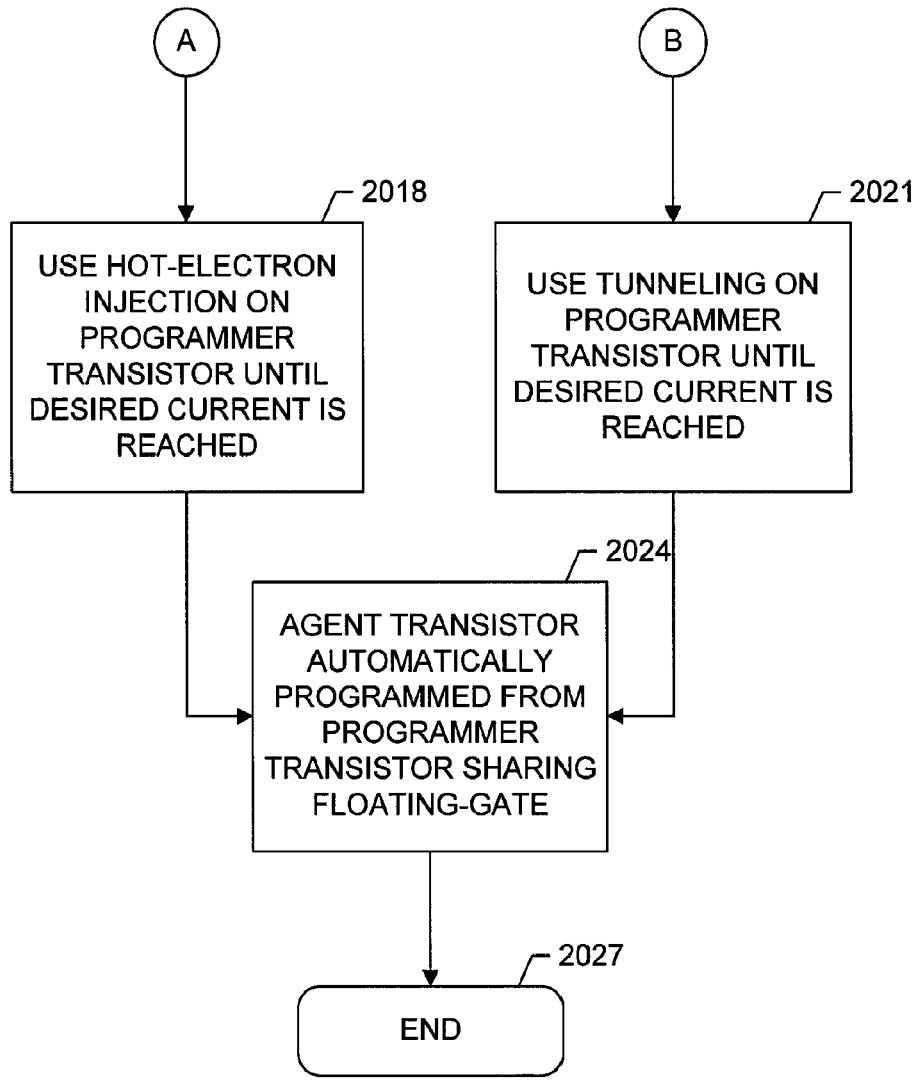

FIGS. 20A-20B provide a flow-chart diagram that summarizes the method of indirectly programming an operational transistor 103 (pFET) by using a programmer transistor 103 (pFET). In a pFET-pFET configuration the method 2000 begins at 2006 by first lowering the currents through the agent transistor 103 and programmer transistor 103 to the subthreshold regime. At 2009, a determination is made as to whether the desired current is lower than the present current of the programmer transistor 103. If at 2009 a determination is made that the desired current is lower than the present current, then the method 2000 proceeds to 2018 described below.

If, however, at 2009 a determination is made that the desired current is not lower than the present current, then at 2012 a determination is made as to whether the desire current is higher than the present current. If at 2012 a determination is made that the desired current is not higher than the present current, then the method 2000 terminates operation, because the present current is equal to the desired current.

If, however, at 2012 a determination is made that the desired current is higher than the present current, then the method 2000 proceeds to 2021 where tunneling is used on the program transistor 103 until the desired current is reached. Next, at 2024, the agent transistor 103 is automatically programmed with the desired current, as the agent transistor 103 and the programmer transistor share a common floating-gate 112, The method 2000 then terminates after successful indirect programming of the agent transistor 103.

At 2018, hot-electron injection is used on the programmer transistor until the desired current is reached. The method 2000 then proceeds to 2024 where the agent transistor 103, as described above, is automatically programmed with the desired current.

Figure 21:
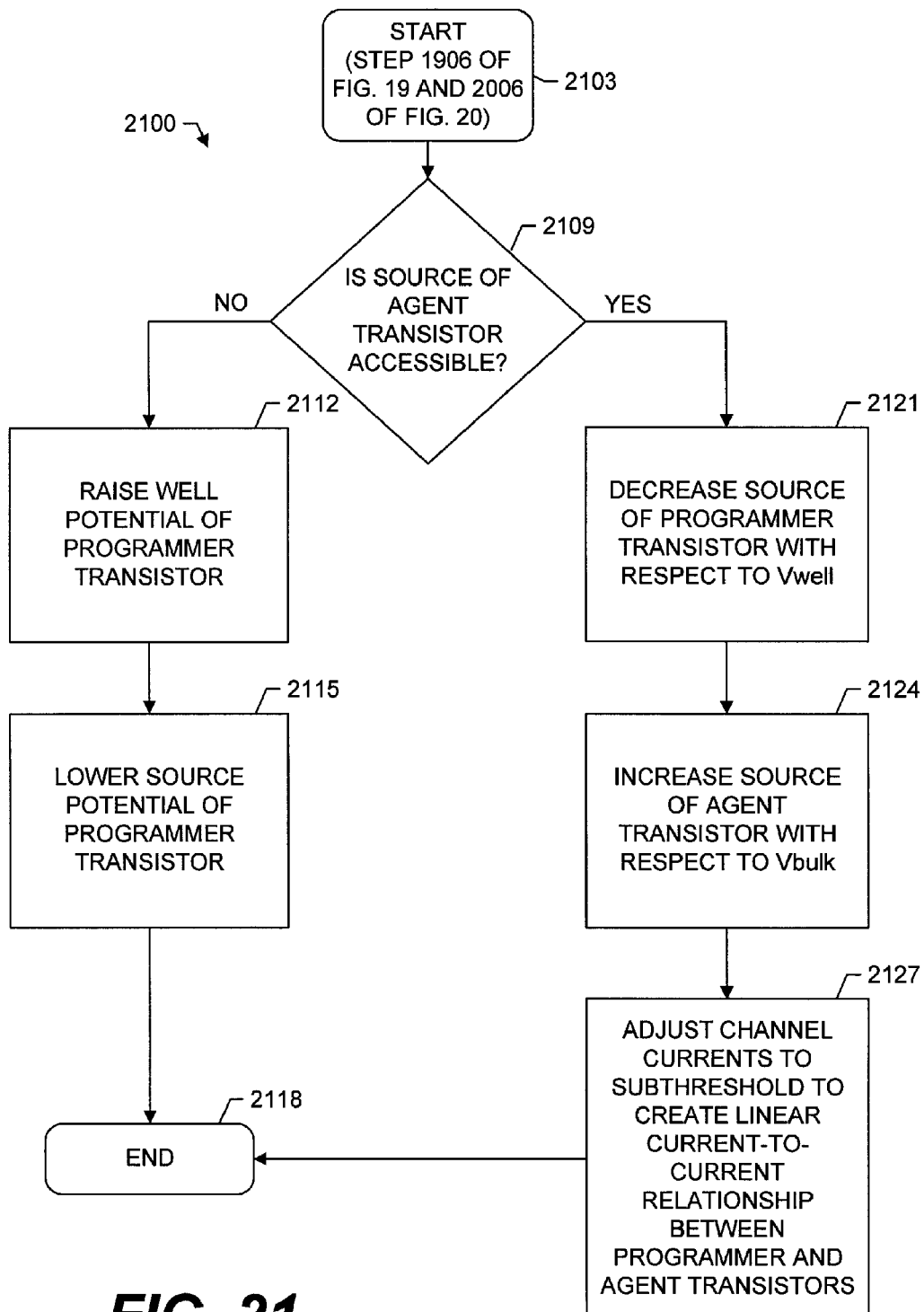
FIG. 21 is a flow-chart diagram illustrating a method of lowering programming and agent transistors to subthreshold for programming in accordance with an exemplary embodiment of the present invention.

FIG. 21 provides a flow-chart diagram that summarizes the method of lowering the agent transistor 103 and programmer transistor 103 to subthreshold. The method 2100 starts at 2109 where a determination is made as to whether the source 106 of the agent transistor 103 is accessible. If, at 2109, a determination is made that the source 106 of the agent transistor 103 is not accessible, then the method 2100 proceeds to 2112 where the well potential of the programmer transistor 103 is raised. Next, at 2115, the source potential of the programmer transistor 103 is lowered. The method 2100 then terminates when subthreshold is achieved for the agent and programmer transistors 103.

If, however, at 2109 a determination is made that the source of the agent transistor 103 is accessible, then the method 2100 proceeds to 2121 where the source 106 of the programmer transistor 103 is decreased with respect to well voltage ($V_{well}$). Next, at 2124, the source of the agent transistor 103 is increased with respect to bulk voltage ($V_{bulk}$), where at 2127 the channel currents are adjusted to subthreshold, thereby creating a linear current-to-current relationship between the programmer and agent transistors 103. The method 2100 then terminates as subthreshold has been achieved.

The present invention demonstrates that a floating-gate pFET 103 may be used as a viable switch element in a crossbar network. The floating-gate pFETs 103 are capable of transmission-gate resistance levels with a capacitance on the order of a single pass-FET. As a result, switch networks using floating-gate pFETs 103 may have a significant bandwidth advantage over traditional transmission gate architectures. The present invention also removes the isolation switch components generally coupled with each transistor 103 and provides a single switch for each row and each column of an array, thereby greatly decreasing the amount of die space required to implement the FPAA crossbar switch network. Programming a particular transistor 103, a row or column of transistors 103, or a subset of transistors 103 may be accomplished through selection programming.

Moreover, the present invention provides a new method of programming floating-gate transistors 103 that overcome problems associated with traditional direct programming, such as the difficulty of programming nFETs and the parasitics associated with the isolation circuitry needed for direct programming. Indirect programming provides for a systematic approach to programming both pFETs and nFETs indirectly. Such an approach may easily be extended to large arrays of floating-gate devices (such as FPAA crossbar switch networks), so that a large number of current sources may be programmed without invasively disconnecting each device from the circuit. Further, directly and indirectly programmed floating-gate transistors 103 can coexist in the same large array, so that each might be used for a particular advantage.

Indirect programming provides runtime programming capabilities without the need for isolating the transistor 103 from the circuit, thereby eliminating the need for isolation switches. Further, the operational transistor 103 may be free from any programming components, as all programming components are associated with the programmer transistor 103, which is coupled to the operational transistor 103 via a common floating-gate 112. The present invention, therefore, provides for programming a particular transistor 103 without stopping the flow of data on the operational circuitry. Also, a smaller silicon footprint is necessary to implement the indirect programming scheme.

The method of indirect programming provided by the present invention also allows certain circuits to be transformed into a programmable version that would not have been previously possible. The aforementioned programmable nFET current mirror is now possible, and a neuron circuit that cannot properly operate due to the parasitics of the isolation circuitry may now be made.

New possibilities with floating-gate programming also exist. As the agent transistor 103 does not need to be removed from the circuit, indirect programming removes the necessity of a separate programming phase and an operational phase. This allows the possibility of run-time recalibration and adaptation to be carried out by the programming pFET. Indirect programming offers solutions to many of the problems of direct programming while also providing new and unique capabilities to augment the analog designer's toolbox.

Further, the present invention provides a unique method of programming the transistor 103 by utilizing saturation techniques, instead of conventional pulse and measure methodology. The present invention uses the relationship between the gate voltage and the saturation point of the transistor 103 to accurately program the desired current to the programmer transistor 103, and, accordingly, to the operational transistor 103.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, can be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A floating-gate transistor array comprising:
    a first transistor having a first source, a first drain, and a first floating gate;
    a second transistor having a second source, a second drain, and a second floating gate;
    a first capacitor having a first terminal and a second terminal, wherein the first terminal of the first capacitor is coupled to the first floating gate of first transistor;
    a second capacitor having a first terminal and a second terminal, wherein the first terminal of the second capacitor is coupled to the second floating gate of the second transistor;
    a first row programming switch having a first output, wherein the first output of the first row programming switch is coupled to the second terminal of the first capacitor and the second terminal of the second capacitor;
    a third transistor having a third source, a third drain, and a third floating gate;
    a third capacitor having a first terminal and a second terminal, wherein the first terminal of the third capacitor is coupled to the third floating gate of the third transistor;
    a second row programming switch having a first output, wherein the first output of the second row programming switch is coupled to the second terminal of the third capacitor;
    a first column programming switch having a first output, wherein the first output of the first column programming switch is coupled to the first drain of the first transistor and the third drain of the third transistor; and
    a second column programming switch having a first output, wherein the first output of the second column programming switch is coupled to the second drain of the second transistor.

2. The floating-gate transistor array of claim 1, wherein the first source line of the first transistor and the second source line of the second transistor are coupled to a common source node.

3. The floating-gate transistor array of claim 1, wherein the first drain line of the first transistor and the third drain line of the third transistor are coupled to a common drain node.

4. A programming circuit for indirectly programming a floating gate transistor operating within an operational circuit without isolating the floating gate transistor from the remainder of the operational circuit, the programming circuit comprising:
    an operational transistor having a first source, a first drain, and a first floating gate, the first source and the first drain being connected to an operational circuit;
    a programming transistor having a second source adapted for connection to a first programming voltage source, a second drain adapted for connection to a second programming voltage source, and a second floating gate, the second floating gate being electrically coupled to the first floating gate of the operational transistor;
    an input capacitor having a first terminal connected to the second floating gate and a second terminal adapted for connection to a gate voltage source for delivering a predetermined gate voltage to the second floating gate; and
    wherein the first floating gate is charged to a first gate charge when the second floating gate is programmed with the first gate charge.

5. The programming circuit of claim 4, further comprising:
    a tunneling capacitor having a first terminal connected to the second floating gate and a second terminal adapted for connection to a tunneling voltage source for delivering a predetermined tunneling voltage to the second floating gate; and
    wherein the first gate charge is reduced when the predetermined tunneling voltage is delivered to the second floating gate.

6. A method of indirectly programming an operational floating gate transistor having a first source, first drain, and first floating gate, operating within an operational circuit without isolating the operational floating gate transistor from the remainder of the operational circuit using a programming floating gate transistor having a second source, a second, drain, and a second floating gate, the second floating gate being electrically coupled to the first floating gate, the method comprising:

applying a first predetermined voltage signal to the second source;

coupling a second predetermined voltage signal into the second floating gate via a capacitor connected to the second floating gate; and applying a third predetermined voltage signal to the second drain until a charge on the first floating gate reaches a predetermined value.

* * * * *